US010741950B1

(12) United States Patent
Consoli et al.

(10) Patent No.: US 10,741,950 B1
(45) Date of Patent: Aug. 11, 2020

(54) CIRCUIT CARD ASSEMBLIES FOR A COMMUNICATION SYSTEM

(71) Applicants: TE CONNECTIVITY CORPORATION, Berwyn, PA (US); TYCO ELECTRONICS JAPAN G.K., Kawasaki-shi (JP)

(72) Inventors: John Joseph Consoli, Harrisburg, PA (US); Chad William Morgan, Carneys Point, NJ (US); Hiroshi Shirai, Tokorozawa (JP)

(73) Assignees: TE CONNECTIVITY CORPORATION, Berwyn, PA (US); TYCO ELECTRONICS JAPAN G.K., Kawasaki-Shi (JP)

( * ) Notice: Subject to any disclaimer, the term of this patent is extended or adjusted under 35 U.S.C. 154(b) by 0 days.

(21) Appl. No.: 16/353,007

(22) Filed: Mar. 14, 2019

(51) Int. Cl.
  *H01R 12/73* (2011.01)
  *H01R 12/72* (2011.01)
  *H01R 12/71* (2011.01)

(52) U.S. Cl.
  CPC ......... *H01R 12/737* (2013.01); *H01R 12/712* (2013.01); *H01R 12/727* (2013.01); *H05K 2201/04* (2013.01)

(58) Field of Classification Search
  CPC .... H01R 12/52; H01R 12/712; H01R 12/716; H01R 12/721; H01R 12/727; H01R 12/735; H01R 12/737; H05K 2201/04
  See application file for complete search history.

(56) References Cited

U.S. PATENT DOCUMENTS

| 3,587,029 | A | | 6/1971 | Knowles et al. | |
| 4,560,221 | A | | 12/1985 | Olsson | |
| 4,632,475 | A | * | 12/1986 | Tomita | H01R 35/04 439/1 |
| 4,863,388 | A | * | 9/1989 | Reimer | H01R 12/83 439/31 |

(Continued)

FOREIGN PATENT DOCUMENTS

| EP | 2451262 A3 | 3/2013 |
| EP | 2346117 B1 | 3/2014 |

(Continued)

OTHER PUBLICATIONS

International Search Report and Written Opinion for corresponding PCT Application No. PCT/IB2018/051321 dated Jun. 12, 2018 (9 pages).

(Continued)

*Primary Examiner* — Oscar C Jimenez

(57) ABSTRACT

A communication system includes first and second circuit card assemblies mated such that first and second PCBs move relative to each other along a board mating axis parallel to a slot in the first PCB with the first PCB oriented perpendicular to the second PCB and with first and second mating ends of first and second electrical connectors oriented parallel to the board mating axis. The first and second circuit card assemblies are mated such that the first electrical connector and the second electrical connector move relative to each other along a connector mating axis perpendicular to the board mating axis. Mating interfaces the contacts are oriented at contact mating angles non-parallel to the board loading axis and non-parallel to the connector mating axis.

20 Claims, 13 Drawing Sheets

(56) References Cited

U.S. PATENT DOCUMENTS

| | | | |
|---|---|---|---|
| 5,114,353 A | 5/1992 | Sample | |
| 5,445,529 A * | 8/1995 | Yamamoto | H01R 12/716 439/660 |
| 5,676,559 A | 10/1997 | Laub et al. | |
| 5,780,172 A | 7/1998 | Fister et al. | |
| 5,849,424 A | 12/1998 | Sugawara et al. | |
| 6,024,582 A * | 2/2000 | Wu | H01R 13/20 439/74 |
| 6,207,298 B1 | 3/2001 | Fukui | |
| 6,796,822 B2 | 9/2004 | Sato et al. | |
| 6,918,775 B2 | 7/2005 | Korsunsky et al. | |
| 7,086,866 B1 | 8/2006 | Folan et al. | |
| 7,322,834 B2 | 1/2008 | Hu et al. | |
| 7,326,092 B2 | 2/2008 | Fedder et al. | |
| 7,435,095 B1 | 10/2008 | Yi | |
| 7,540,744 B1 | 6/2009 | Minich | |
| 7,708,578 B1 | 5/2010 | Lenox | |
| 7,771,207 B2 | 8/2010 | Hamner et al. | |
| 7,789,667 B2 | 9/2010 | Hamner et al. | |
| 7,824,187 B1 | 11/2010 | Yi | |
| 7,918,683 B1 | 4/2011 | Hamner et al. | |
| 7,988,457 B1 | 8/2011 | Morgan | |
| 8,113,851 B2 | 2/2012 | Hamner et al. | |
| 8,199,511 B2 | 6/2012 | Kim et al. | |
| 8,376,766 B1 | 2/2013 | Huettner et al. | |
| 8,512,081 B2 | 8/2013 | Stokoe | |
| 8,684,610 B2 | 4/2014 | Nichols | |
| 9,551,625 B2 | 1/2017 | Brugger et al. | |
| 9,608,371 B2 | 3/2017 | Bonzom et al. | |
| 9,608,382 B2 | 3/2017 | McClellan et al. | |
| 9,859,640 B1 | 1/2018 | Horning et al. | |
| 9,917,406 B1 | 3/2018 | Iwasaki et al. | |
| 9,966,163 B2 | 5/2018 | Sawada | |
| 10,587,064 B1 * | 3/2020 | Consoli | H05K 1/14 |
| 2002/0071259 A1 | 6/2002 | Roos | |
| 2003/0186597 A1 | 10/2003 | Suzuki et al. | |
| 2005/0064733 A1 | 3/2005 | Korsunsky et al. | |
| 2005/0070136 A1 | 3/2005 | Korsunsky et al. | |
| 2005/0084733 A1 | 4/2005 | Tarver | |
| 2005/0181637 A1 | 8/2005 | Williams et al. | |
| 2007/0184676 A1 | 8/2007 | Minich | |
| 2008/0045087 A1 | 2/2008 | Yi et al. | |
| 2008/0166901 A1 * | 7/2008 | Weber | H01R 35/04 439/79 |
| 2014/0065849 A1 | 3/2014 | Kida et al. | |
| 2016/0006150 A1 | 1/2016 | Bachmutsky | |
| 2016/0013570 A1 * | 1/2016 | Fry, Jr. | H01R 24/84 439/78 |
| 2018/0040989 A1 | 2/2018 | Chen | |
| 2018/0261941 A1 | 9/2018 | Consoli et al. | |
| 2019/0052001 A1 | 2/2019 | Consoli et al. | |
| 2019/0052008 A1 | 2/2019 | Consoli et al. | |
| 2019/0052014 A1 | 2/2019 | Consoli et al. | |
| 2019/0103691 A1 * | 4/2019 | Sypolt | H05K 7/1417 |
| 2019/0103692 A1 * | 4/2019 | Consoli | H01R 12/737 |

FOREIGN PATENT DOCUMENTS

| | | |
|---|---|---|
| JP | 2003044794 A | 2/2003 |
| JP | 2005158337 A | 6/2005 |
| TW | M537321 U | 2/2017 |
| WO | 2007092113 A2 | 8/2007 |
| WO | 2014021219 A1 | 2/2014 |

OTHER PUBLICATIONS

U.S. Appl. No. 15/945,767, filed Apr. 5, 2018, entitled "Circuit Card Assemblies for a Communication System" (57 pages).

U.S. Appl. No. 15/945,775, filed Apr. 5, 2018, entitled "Electrical Connector for a Circuit Card Assembly of a Communication System" (61 pages).

U.S. Appl. No. 15/945,812, filed Apr. 5, 2018, entitled "Circuit Card Assemblies for a Communication System" (57 pages).

U.S. Appl. No. 16/145,913, filed Sep. 28, 2018, entitled "Electrical Connector and Connector System Having Plated Ground Shields" (44 pages).

Kerridge "Fast Backplane Connectors Disguise Digital Transmission Lines" EDN Europe Design Feature XP-000724062; 1997 (6 pages).

U.S. Appl. No. 16/255,255, filed Jan. 23, 2019, entitled "Circuit Card Assemblies for a Communication System" (61 pages).

U.S. Appl. No. 15/945,821, filed Apr. 5, 2018, entitled "Circuit Card Assemblies for a Communication System" (34 pages).

U.S. Appl. No. 15/945,802, filed Apr. 8, 2018, entitled "Circuit Card Assemblies for a Communication System" (37 pages).

U.S. Appl. No. 15/945,787, filed Apr. 8, 2018, entitled "Electrical Connector for a Circuit Card Assembly of a Communication System" (40 pages).

* cited by examiner

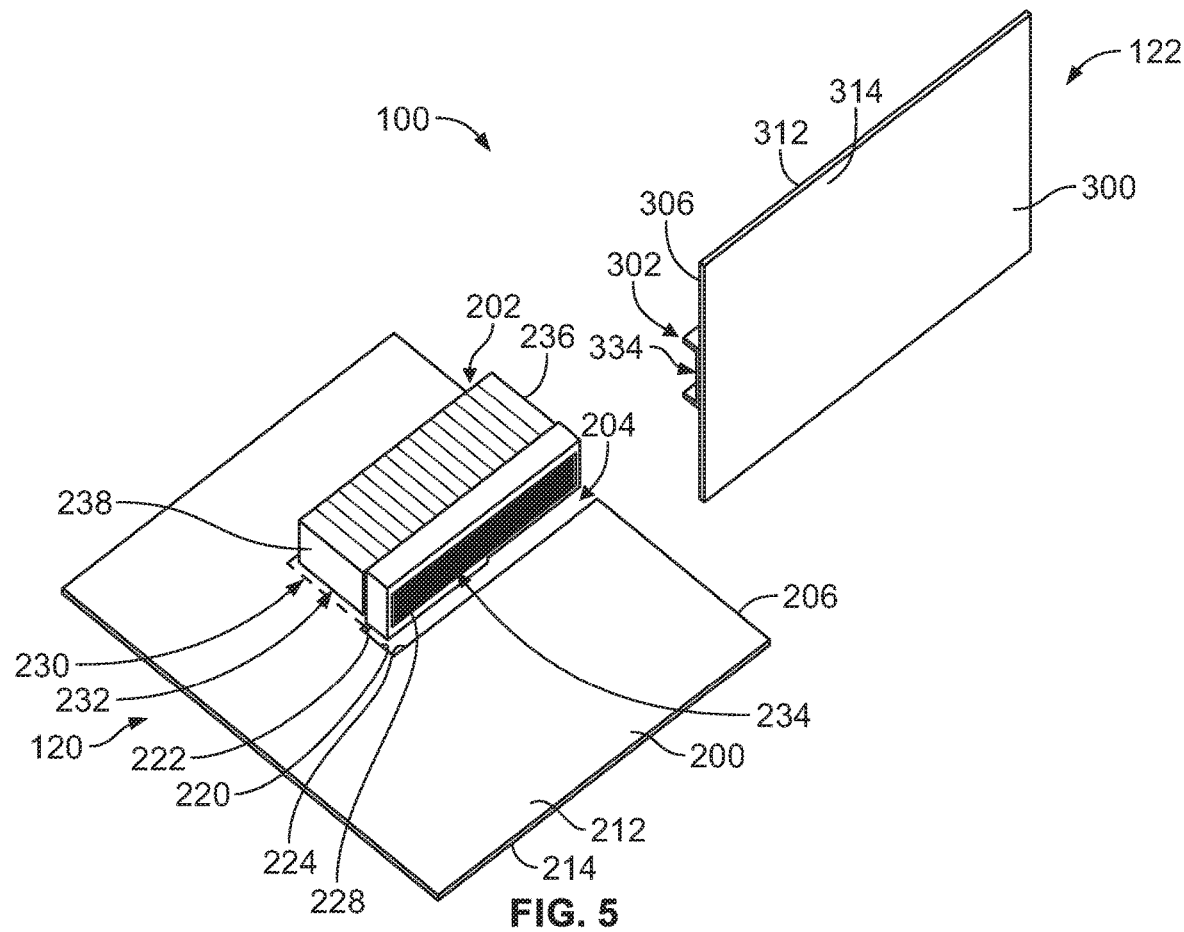
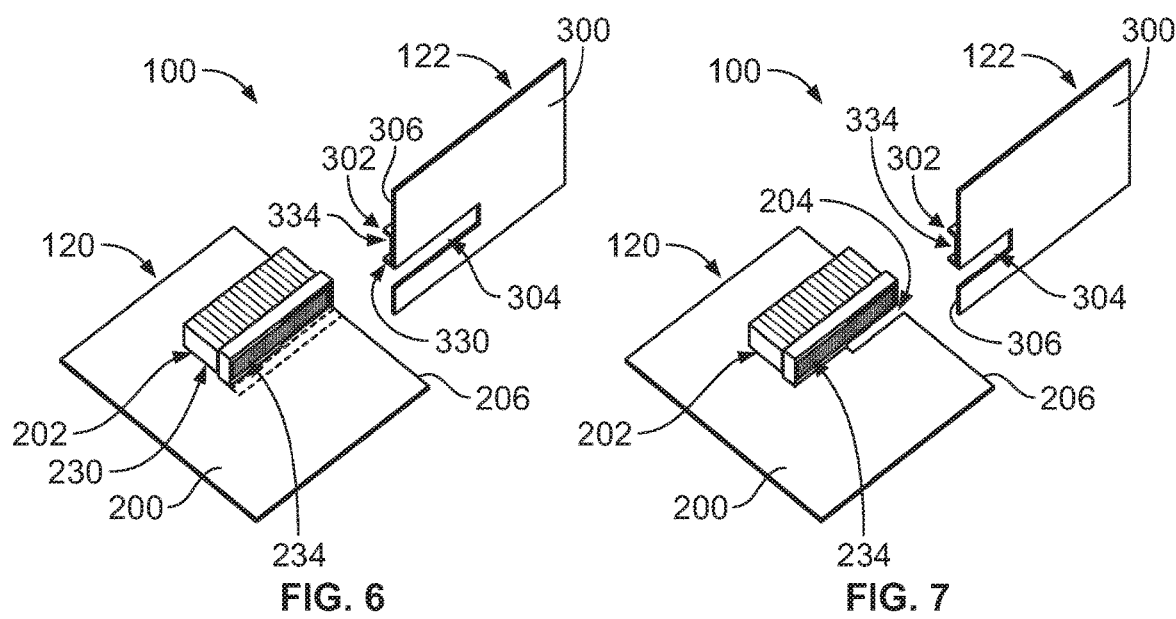

CIRCUIT CARD ASSEMBLIES FOR A COMMUNICATION SYSTEM

BACKGROUND OF THE INVENTION

The subject matter herein relates generally to circuit card assemblies for communication systems.

Communication systems are in use in various applications, such as network switches. The communication systems include various circuit cards, such as backplanes and/or daughtercards, which are coupled together to electrically connect various circuits. For example, the circuit cards include electrical connectors that are mated to electrical connectors of one or more other circuit cards. Some communication systems use a backplane or midplane that is perpendicular to the mating direction of the daughtercards. However, such backplanes or midplanes block airflow through the communication system leading to overheating of components or limiting operating speeds to avoid overheating.

Other communication systems arrange both circuit cards parallel to the mating direction to allow airflow through the system. The circuit cards are typically oriented perpendicular to each other (for example, horizontally and vertically). The electrical connectors are provided at edges of both circuit cards and direct mate to each other. Conventional communication systems utilize right angle electrical connectors on both cards that direct mate with each other in an orthogonal orientation. The mating interfaces of the electrical connectors are parallel to the mating edges of the circuit cards such that the electrical connectors are mated in a direction parallel to the mating direction of the circuit cards. However, such right angle electrical connectors are expensive to manufacture and occupy a large amount of space in the system, thus blocking airflow through the system. Furthermore, adding density to the system in the form of a greater number of signal contacts increases the size of the connector in at least one direction, further blocking airflow through the system.

A need remains for a cost effective and reliable communication system allowing airflow through the communication system for cooling the electrical components.

BRIEF DESCRIPTION OF THE INVENTION

In one embodiment, a communication system includes a first circuit card assembly and a second circuit card assembly. The first circuit card assembly includes a first PCB and a first electrical connector. The first PCB includes a first slot extending rearward from a first mating edge of the first PCB. The first electrical connector is mounted to the first PCB along the first slot. The first electrical connector has a first mating end and first contacts at the first mating end. Each of the first contacts has a first mating interface. The second circuit card assembly has a second PCB and a second electrical connector. The second PCB has a second mating edge. The second electrical connector is mounted to the second PCB proximate to the second mating edge. The second electrical connector has a second mating end and second contacts at the second mating end. Each of the second contacts has a second mating interface. The first and second circuit card assemblies are mated by loading the second PCB into the first slot in a board loading direction such that the first PCB and the second PCB move relative to each other along a board loading axis parallel to the first slot with the first PCB oriented perpendicular to the second PCB and with the first and second mating ends of the first and second electrical connectors being oriented parallel to the board loading axis. The second mating edge of the second PCB are received in the first slot to align the second mating end of the second electrical connector with the first mating end of the first electrical connector for mating the second electrical connector with the first electrical connector. The first electrical connector is mated with the second electrical connector in a connector mating direction along a connector mating axis perpendicular to the board loading axis. The first mating interfaces of the first contacts are oriented at first contact mating angles and the second mating interfaces of the second contacts are oriented at second contact mating angles complementary to the first contact mating angles to guide mating of the first contacts with the second contacts as the first and second PCBs are mated in the board loading direction and the first and second connectors are mated in the connector mating direction. The first and second contact mating angles are non-parallel to the board loading axis and being non-parallel to the connector mating axis.

In another embodiment, a circuit card assembly is provided for a communication system including a PCB having a first surface and a second surface extending along a primary axis and a secondary axis. The PCB has a mating edge between the first and second surfaces generally parallel to the secondary axis. The PCB has a mounting area on the first surface adjacent the mating edge. The circuit card assembly includes an electrical connector mounted to the first surface at the mounting area. The electrical connector has a housing extending between a front and a rear. The front is provided proximate to the mating edge. The electrical connector has a mounting end extending between the front and the rear being mounted to the mounting area. The electrical connector has a mating end extending between the front and the rear along the primary axis. The mating end is configured to be mated to a mating electrical connector. The electrical connector has contacts held by the housing being terminated to the PCB. Each contact has a mating end extending along a mating axis between a neck and a head. The head has a tip configured to be mated with a mating contact in a contact mating direction along the mating axis. The mating axis is angled non-perpendicular to the mating end of the electrical connector.

In a further embodiment, a communication system is provided including a first circuit card assembly and a second circuit card assembly. The first circuit card assembly has a first PCB and a first electrical connector mounted to the first PCB. The first PCB has a first surface and a second surface extending along a primary axis and a secondary axis. The first PCB has a first mating edge between the first and second surfaces generally parallel to the secondary axis of the first PCB. The first PCB has a first slot between the first and second surfaces open at the first mating edge and extending a length generally along the primary axis of the first PCB. The first PCB has a first mounting area on the first surface adjacent the first slot with the first electrical connector mounted to the first mounting area. The first electrical connector has a front and a rear opposite the front. The first electrical connector has a mounting end extending between the front and the rear being mounted to the mounting area. The first electrical connector has a mating end extending between the front and the rear generally parallel to the primary axis of the first PCB. The first electrical connector has first contacts including mating ends at the mating end of the first electrical connector and terminating ends at the mounting end of the first electrical connector terminated to the first PCB. Each of the first contacts have a first mating interface. The second circuit card assembly has a second PCB and a second electrical connector mounted to the second PCB. The second PCB has a first surface and a second surface extending along a primary axis and a secondary axis. The second PCB has a second mating edge between the first and second surfaces generally parallel to the secondary axis of the second PCB. The second PCB has a second mounting area on the first surface proximate to the second mating edge with the second electrical connector mounted to the second mounting area. The second electrical connector has a front and a rear opposite the front. The second electrical connector has a mounting end extending between the front and the rear being mounted to the mounting area. The second electrical connector has a mating end extending between the front and the rear generally parallel to the primary axis of the second PCB. The second electrical connector has second contacts including mating ends at the mating end of the second electrical connector and terminating ends at the mounting end of the second electrical connector terminated to the second PCB. Each of the second contacts has a second mating interface. The second mating edge of the second PCB being received in the first slot to align the mating end of the second electrical connector with the mating end of the first electrical connector. The first and second circuit card assemblies are mated by loading the second PCB into the first slot in a board loading direction such that the first PCB and the second PCB move relative to each other along a board loading axis parallel to the first slot with the first PCB oriented perpendicular to the second PCB and with the first and second mating ends of the first and second electrical connectors being oriented parallel to the board loading axis. The second mating edge of the second PCB is received in the first slot to align the second mating end of the second electrical connector with the first mating end of the first electrical connector for mating the second electrical connector with the first electrical connector. The first electrical connector is mated with the second electrical connector in a connector mating direction along a connector mating axis perpendicular to the board loading axis. The mating ends of the first contacts extend along first beam axes oriented at first contact mating angles and the mating ends of the second contacts extend along second beam axes oriented at second contact mating angles complementary to the first contact mating angles for mating the first and second contacts in a contact mating direction as the first and second PCBs are mated in the board loading direction and the first and second connectors are mated in the connector mating direction. The contact mating direction is non-parallel to the board loading axis and non-parallel to the connector mating axis.

BRIEF DESCRIPTION OF THE DRAWINGS

FIG. 5 is a perspective view of a portion of the communication system showing the first circuit card assembly and the second circuit card assembly poised for mating.

FIG. 6 is a perspective view of a portion of the communication system in accordance with an exemplary embodiment.

FIG. 7 is a perspective view of a portion of the communication system in accordance with an exemplary embodiment.

DETAILED DESCRIPTION OF THE INVENTION

Figure 1:
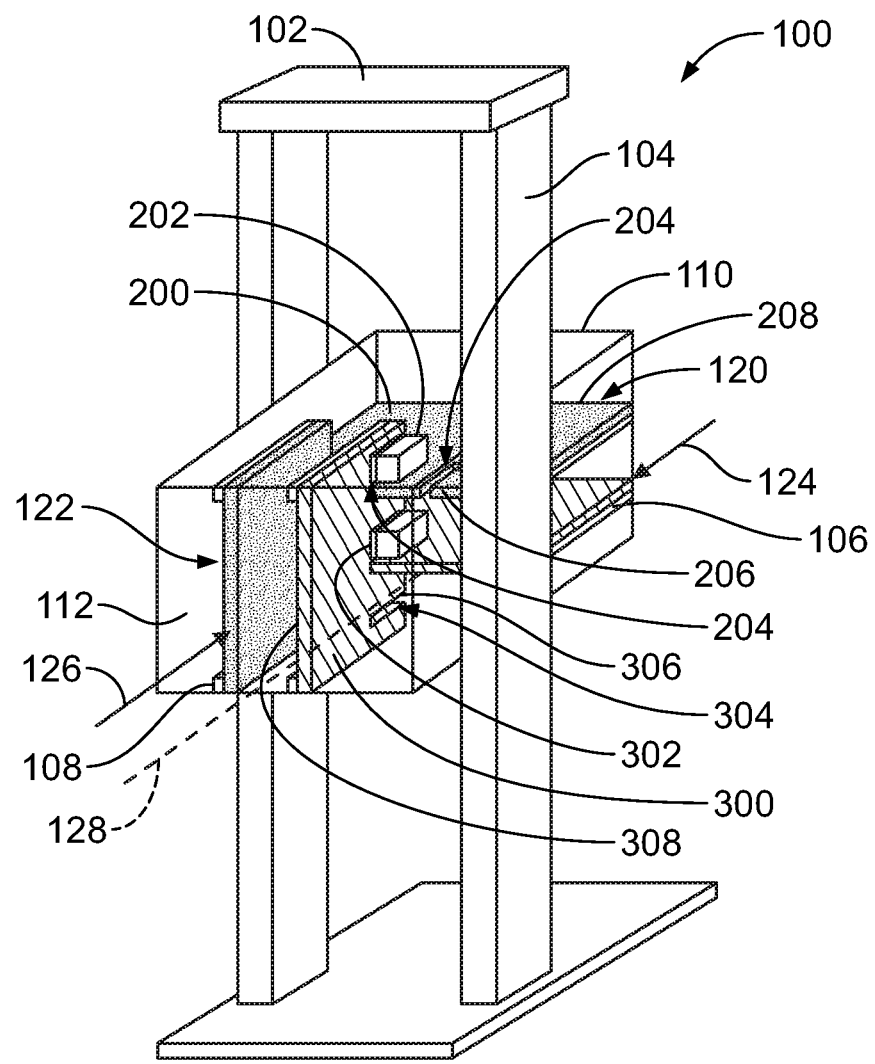
FIG. 1 illustrates a communication system formed in accordance with an exemplary embodiment.

FIG. 1 illustrates a communication system 100 formed in accordance with an exemplary embodiment. The communication system 100 includes a chassis 102 having a frame 104 configured to hold communication components, such as network components, such as circuit card assemblies. Optionally, the chassis 102 may include a cabinet (not shown) surrounding components of the communication system 100. In an exemplary embodiment, the frame 104 includes a plurality of racks 106, 108 for holding circuit card assemblies. For example, the communication system 100 may form part of a data center switch having one or more backplanes and/or daughter cards, such as line cards, switch cards or other types of circuit cards that may be electrically connected together.

In an exemplary embodiment, the communication system 100 includes a front end 110 and a rear end 112. The racks 106 are provided at the front end 110 and the racks 108 are provided at the rear end 112. One or more circuit card assemblies 120 may be received in the racks 106 at the front end 110 and one or more circuit card assemblies 122 may be received in the racks 108 at the rear end 112. The circuit card assemblies 120 may be referred to hereinafter as first circuit card assemblies 120 or front circuit card assemblies 120 to differentiate from the circuit card assemblies 122, which may be referred to hereinafter as second circuit card assemblies 122 and/or rear circuit card assemblies 122. In an exemplary embodiment, the circuit card assemblies 120, 122 are orthogonal to each other. For example, in the illustrated embodiment, the front circuit card assemblies 120 are oriented horizontally while the rear circuit card assemblies 122 are oriented vertically; however, other orientations are possible in alternative embodiments.

The front circuit card assemblies 120 are electrically connected to one or more of the rear circuit card assemblies 122. Optionally, the front circuit card assemblies 120 and/or the rear circuit card assemblies 122 may be removable from the corresponding racks 106, 108. The racks 106, 108 guide and position the circuit card assemblies 120, 122, respectively. For example, the racks 106 position the front circuit card assemblies 120 for mating with multiple rear circuit card assemblies 122 and the racks 108 position the rear circuit card assemblies 122 for mating with multiple front circuit card assemblies 120. The front circuit card assemblies 120 may be loaded into the frame 104 through the front end 110 while the rear circuit card assemblies 122 may be loaded into the frame 104 through the rear end 112. For example, the front circuit card assemblies 120 are configured to be loaded into corresponding racks 106 in a loading direction 124 and the rear circuit card assemblies 122 are configured to be loaded into corresponding racks 108 in a loading direction 126. The loading directions 124, 126 may be parallel to a loading axis 128.

The first circuit card assembly 120 includes a first printed circuit board (PCB) 200 and a first electrical connector 202 mounted to the first PCB 200. The first PCB 200 may include any number of the electrical connectors 202, such as one electrical connector 202 for electrically connecting to each corresponding second circuit card assembly 122. Optionally, the first PCB 200 may include one or more first slots 204 for receiving PCBs of corresponding second circuit card assemblies 122 when mated thereto.

The first PCB 200 extends between a first mating edge 206 at a front of the PCB 200 and a rear edge 208 opposite the mating edge 206. Optionally, the rear edge 208 may include a handle or other feature for insertion and removal of the first circuit card assembly 120. The first PCB 200 may include one or more electrical components thereon. For example, the electrical components may be processors, memory modules, batteries, fans, signal processing devices, and the like.

The second circuit card assembly 122 includes a second PCB 300 and a second electrical connector 302 mounted to the second PCB 300. The second PCB 300 may include any number of the electrical connectors 302, such as one electrical connector 302 for electrically connecting to each corresponding first circuit card assembly 120. The second PCB 300 extends between a second mating edge 306 at a front of the PCB 300 and a rear edge 308 opposite the mating edge 306. The first and second mating edges 206, 306 of the first and second PCBs 200, 300 interface with each other when the first and second circuit card assemblies 120, 122 are mated. For example, the fronts of the PCBs 200, 300 face each other and the rear edges 208, 308 face away from each other. Optionally, the rear edge 308 may include a handle or other feature for insertion and removal of the second circuit card assembly 122. The second PCB 300 may include one or more electrical components, such as processors, memory modules, batteries, fans, signal processing devices, and the like.

Optionally, the second PCB 300 may include one or more second slots 304 for receiving first PCBs 200 of corresponding first circuit card assemblies 120 when mated thereto. In various embodiments, both PCBs 200, 300 include the first and second slots 204, 304, respectively. In other various embodiments, only the first PCB 200 includes the first slots 204, whereas in other various embodiments, only the second PCB 300 includes the second slots 304.

The first slots 204 and/or the second slots 304 allow the first and second PCBs 200, 300 to be internested and overlapping such that the first and second electrical connectors 202, 302 are aligned for mating. For example, the first slots 204 and/or the second slots 304 allow the first and second PCBs 200, 300 to overlap to align mating ends of the first and second electrical connectors 202, 302 for mating. The arrangement allows the first and second electrical connectors 202, 302 to be mated in a mating direction perpendicular to the loading directions 124, 126. During mating, the first and second PCBs 200, 300 and the first and second electrical connectors 202, 302 may be initially mated together in a board loading direction 130 (FIG. 2) and, at the end of the mating process, the first and second electrical connectors 202, 302 may be mated together in a connector mating direction 132 (FIG. 2) non-parallel to the board loading direction 130, such as perpendicular to the board loading direction 130 or at some other non-parallel angle. The first and second electrical connectors 202, 302, being attached to the first and second PCBs 200, 300, move with the first and second PCBs 200, 300 in the board loading direction 130, even while moving in the connector mating direction 130, leading to multi-axial movement of the first electrical connector 202 and/or the second electrical connector 302 during mating. The contacts of the first and second electrical connectors 202, 302 are arranged for mating in the board loading direction 130 and the connector mating direction 132. For example, in an exemplary embodiment, and as described in further detail below, the contacts are mated in a contact mating direction that is angled transverse to the board loading direction 130 and the connector mating direction 132 (for example, non-parallel/non-perpendicular to the board loading direction 130 and non-parallel/non-perpendicular to the connector mating direction 132).

Having the first and second circuit card assemblies 122 internested and overlapped using the slot(s) 204, 304 allows the first and second electrical connectors 202, 302 to be elongated along the PCBs 200, 300 reducing one or more other dimensions of the electrical connectors 202, 302 (for example, a height and/or a width) allowing a greater amount of airflow through the communication system 100 (for example, from the front end 110 to the rear end 112 and/or from the rear end 112 to the front end 110. The density of contacts in the communication system 100 may be increased by increasing the length of the mating interfaces (e.g., in the loading direction), without increasing in other dimension, such as the height of the width, which does not negatively impact the airflow through the communication system because the height and the width dimensions are the same irrespective of the length. The arrangement may allow the PCBs 200, 300 to overlap to reduce one or more dimensions of the communication system 100, such as a front to rear length of the communication system 100.

Figure 2:
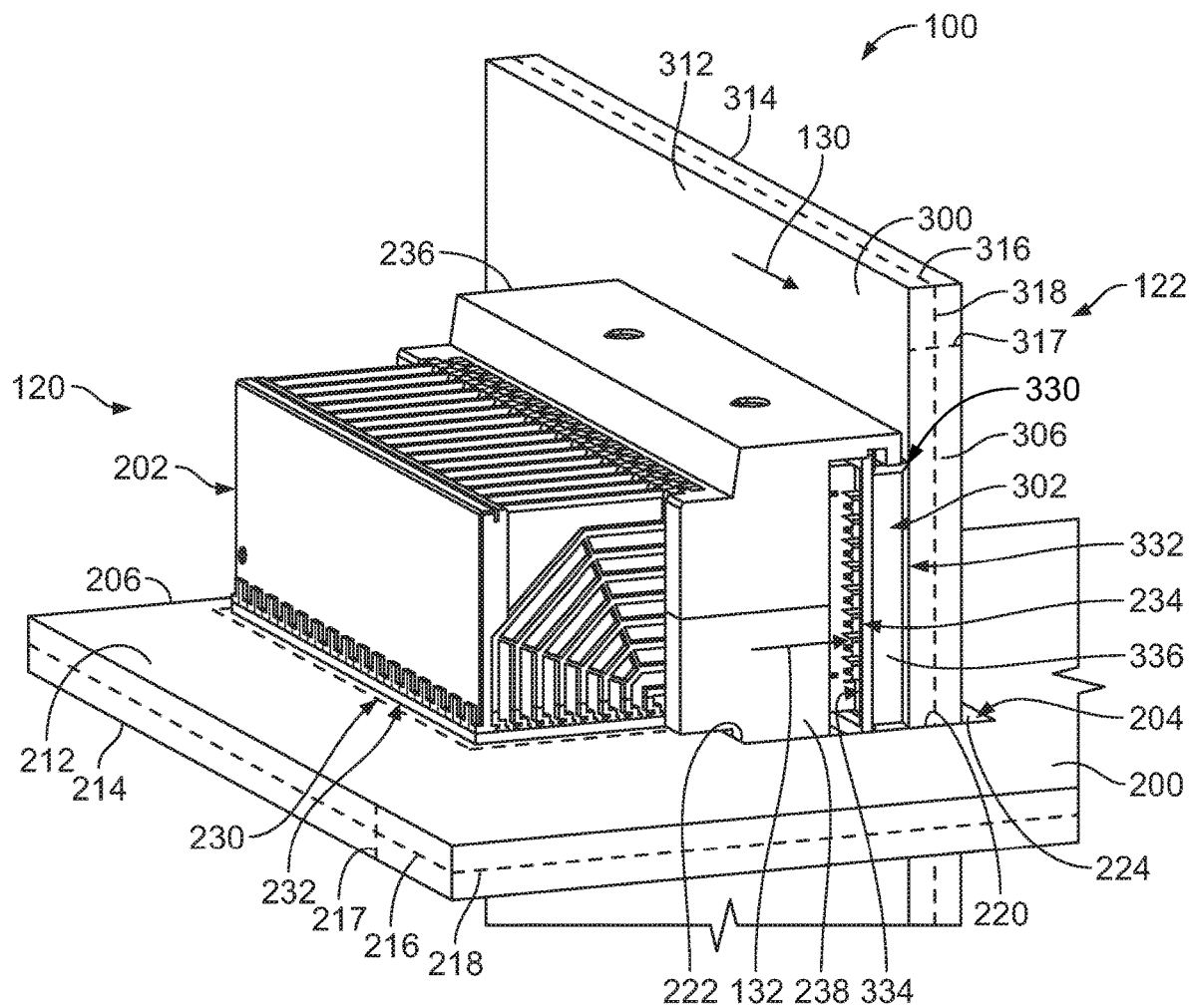
FIG. 2 is a perspective view of a portion of the communication system showing a first circuit card assembly coupled to a second circuit card assembly.
Figure 4:
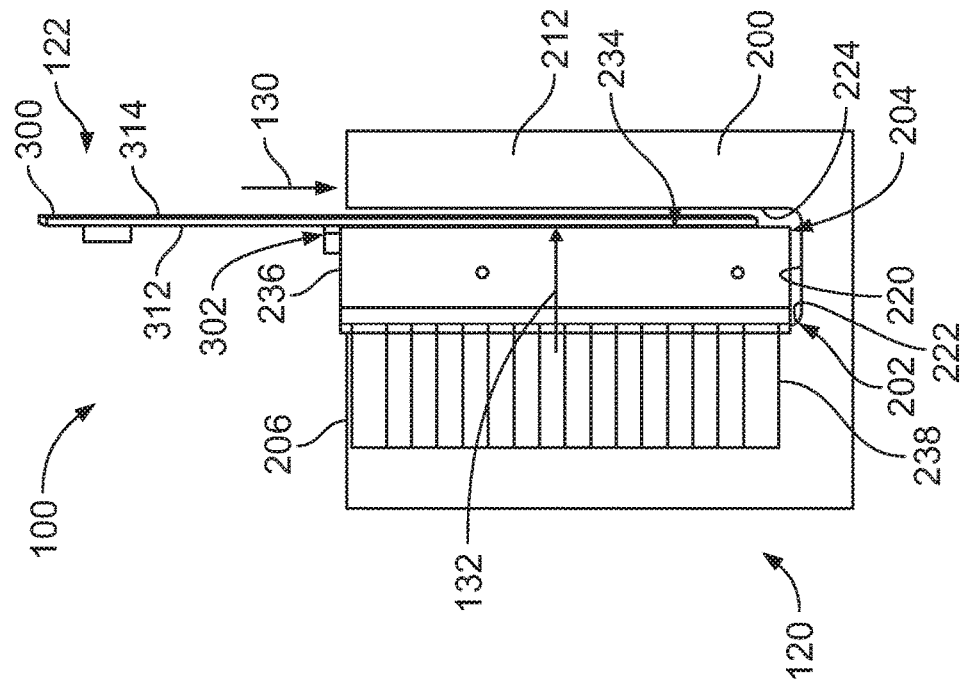
FIG. 4 is a top view of a portion of the communication system showing the first circuit card assembly mated to the second circuit card assembly.
Figure 3:
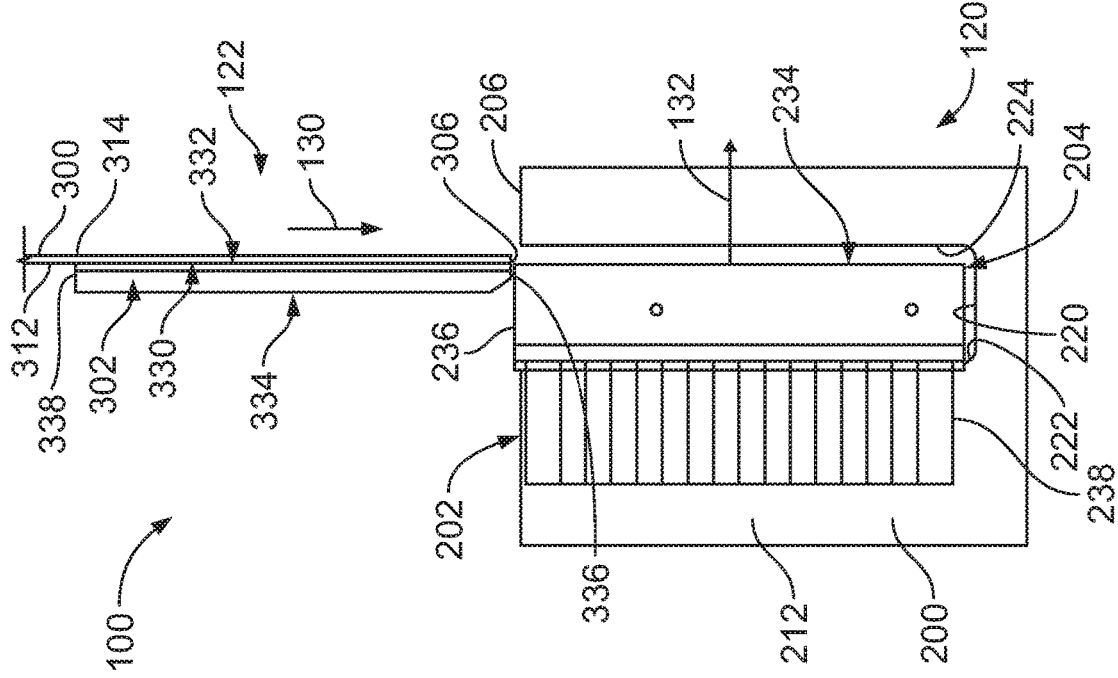
FIG. 3 is a top view of a portion of the communication system showing the first circuit card assembly poised for mating with the second circuit card assembly.

FIG. 2 is a perspective view of a portion of the communication system 100 showing the first circuit card assembly 120 coupled to the second circuit card assembly 122; however, it is noted that the first circuit card assembly 120 may be designed to be coupled to multiple circuit card assemblies 122 and/or the second circuit card assembly 122 may be designed to be coupled to multiple circuit card assemblies 120, such as in the arrangement illustrated in FIG. 1. FIG. 3 is a top view of a portion of the communication system 100 showing the first circuit card assembly 120 poised for mating to the second circuit card assembly 122. FIG. 4 is a top view of a portion of the communication system 100 showing the first circuit card assembly 120 coupled to the second circuit card assembly 122. FIG. 5 is a perspective view of a portion of the communication system 100 showing the first circuit card assembly 120 and the second circuit card assembly 122 poised for mating.

The terms "first", "second", etc. are used merely as labels to generally identify components of the first circuit card assembly 120 or the second circuit card assembly 122, respectively; however, such labels are not used exclusively with the circuit card assemblies 120, 122. Either or both of the circuit card assemblies 120, 122 may include any of the various components or elements described herein and some components may only be described with respect to either the circuit card assembly 120 or the circuit card assembly 122; however, the other of the circuit card assembly 120 or the circuit card assembly 122 may additionally include such components. Furthermore, the components may be described herein with or without the "first" label or the "second" label.

The first circuit card assembly 120 includes the first PCB 200 having the first slot 204 and the electrical connector 202 mounted to the PCB 200 proximate to the first slot 204. The PCB 200 includes a first surface 212 and a second surface 214 being the main surfaces of the PCB 200. In the illustrated embodiment, the first surface 212 is an upper surface and the second surface 214 is a lower surface; however, the PCB 200 may have other orientations in alternative embodiments. The first and second surfaces 212, 214 extend along a primary axis 216 and a secondary axis 218 perpendicular to the primary axis 216. The PCB 200 has a thickness between the first and second surfaces 212, 214 along a transverse axis 217 perpendicular to the primary and secondary axes 216, 218. In an exemplary embodiment, the primary and secondary axes 216, 218 are in a horizontal plane and the transverse axis 217 extends in a vertical direction; however, the PCB 200 may have other orientations in alternative embodiments. In an exemplary embodiment, the primary axis 216 extends between the mating edge 206 and the rear edge 208 (shown in FIG. 1). In an exemplary embodiment, the secondary axis 218 is parallel to the mating edge 206.

The first slot 204 extends entirely through the PCB 200 between the first and second surfaces 212, 214. The first slot 204 is open at the mating edge 206 to receive the second circuit card assembly 122. The first slot 204 extends a length along the primary axis 216 to an end edge 220 remote from the mating edge 206. The first slot 204 has a first side edge 222 and may include a second side edge 224, as in the illustrated embodiment, extending between the mating edge 206 and the end edge 220. Optionally, the side edges 222, 224 may be generally parallel to each other. Alternatively, the side edges 222, 224 may be nonparallel, such as to taper the first slot 204. For example, the first slot 204 may be wider near the mating edge 206 and narrower near the end edge 220. Optionally, the side edges 222, 224 may have chamfered lead-ins at the mating edge 206 to guide the second circuit card assembly 122 into the first slot 204. However, in alternative embodiments, the first slot 204 may be defined only by the end edge 220 and the first side edge 222.

The first PCB 200 includes a mounting area 230 for the electrical connector 202 on the first surface 212. The mounting area 230 is adjacent the first slot 204. For example, the mounting area 230 extends along the mating edge 206 a distance from the first slot 204 and extends along the first side edge 222 of the first slot 204 a distance from the mating edge 206. Optionally, the mounting area 230 may extend beyond the end edge 220 of the first slot 204. The electrical connector 202 is terminated to the PCB 200 at the mounting area 230. For example, contacts 228 that extend through the electrical connector 202 may be soldered to the PCB 200 at the mounting area 230. The mounting area 230 may include plated vias that receive compliant pins or solder tails of the contacts 228 of the electrical connector 202 for termination of the contacts 228 to the PCB 200. Optionally, at least a portion of the electrical connector 202 may extend beyond the first side edge 222 over the first slot 204 and/or at least a portion of the electrical connector 202 may extend forward of the mating edge 206 and/or at least a portion of the electrical connector 202 may extend rearward of the end edge 220. In other various embodiments, the PCB 200 may include more than one mounting area 230 adjacent the first slot 204 for receiving additional electrical connectors 202. For example, multiple electrical connectors 202 may be electrically connected to the same circuit card assembly 122. For example, additional electrical connectors 202 may be provided on both sides of the first slot 204 and/or both sides of the PCB 200.

The first electrical connector 202 is mounted to the PCB 200 at the mounting area 230. In the illustrated embodiment, the electrical connector 202 is a right angle connector having a mounting end 232 perpendicular to a mating end 234. For example, the mounting end 232 may be provided at a bottom of the electrical connector 202 and the mating end 234 may be provided at a side of the electrical connector 202. The electrical connector 202 extends between a front 236 and a rear 238 opposite the front 236. The mounting end 232 extends between the front 236 and the rear 238 at the bottom of the electrical connector 202. The mounting end 232 is mounted to the PCB 200. For example, the electrical connector 202 is mechanically and electrically terminated to the PCB 200 at the mounting end 232. The mating end 234 extends between the front 236 and the rear 238. In the illustrated embodiment, the mating end 234 generally faces the first slot 204 for interfacing with the second electrical connector 302 when the second circuit card assembly 122 is received in the first slot 204. The mating end 234 is configured to be mated to the mating electrical connector defined by the second electrical connector 302 when the second circuit card assembly 122 is received in the first slot 204.

In an exemplary embodiment, the mating end 234 is oriented generally vertically along the transverse axis 217 and extends parallel to the primary axis 216. The mating end 234 faces sideways rather than forward. For example, the mating end 234 is perpendicular to the mating edge 206 of the PCB 200. The front 236 is oriented generally vertically along the transverse axis 217 and extends parallel to the secondary axis 218. The front 236 may be positioned a first distance from the mating edge 206 (either forward of, rearward of or flush with the mating edge 206) and the rear 238 is positioned a second distance from the mating edge 206 greater than the first distance. The mating end 234 spans a majority of the distance between the front 236 and the rear 238. The front 236 is forward facing and, in the illustrated embodiment, is provided near the mating edge 206, such as generally flush with the mating edge 206.

The second circuit card assembly 122 includes the second PCB 300, which may or may not include a slot. In the illustrated embodiment, the PCB 300 does not include a slot. The PCB 300 includes a first surface 312 and a second surface 314 being the main surfaces of the PCB 300. In the illustrated embodiment, the first surface 312 defines a first side and the second surface 314 defines a second side of the PCB 300; however, the PCB 300 may have other orientations in alternative embodiments. The first and second surfaces 312, 314 extend along a primary axis 316 and a secondary axis 318 perpendicular to the primary axis 316. The PCB 300 has a thickness between the first and second surfaces 312, 314 along a transverse axis 317 perpendicular to the primary and secondary axes 316, 318. In an exemplary embodiment, the primary and secondary axes 316, 318 are in a vertical plane and the transverse axis 317 extends in a horizontal direction; however, the PCB 300 may have other orientations in alternative embodiments. In an exemplary embodiment, the primary axis 316 extends between the mating edge 306 and the rear edge 308 (shown in FIG. 1). In an exemplary embodiment, the secondary axis 318 is parallel to the mating edge 306.

In an exemplary embodiment, at least a portion of the PCB 300 is configured to be received in the first slot 204 and may at least partially fill the first slot 204. Such portion may engage the end edge 220, the first side edge 222 and/or the second side edge 224 of the first slot 204 when received therein.

The second PCB 300 includes a mounting area 330 for the electrical connector 302 on the first surface 312. The mounting area 330 extends from the mating edge 306 a distance. The electrical connector 302 is terminated to the PCB 300 at the mounting area 330. For example, contacts 328 of the electrical connector 302 may be soldered to the PCB 300 at the mounting area 330. The mounting area 330 may include plated vias that receive compliant pins or solder tails of the contacts 328 of the electrical connector 302 for termination of the contacts 328 to the PCB 300. Optionally, at least a portion of the electrical connector 302 may extend forward of the mating edge 306. In other various embodiments, the PCB 300 may include more than one mounting area 330 for receiving additional electrical connectors 302. For example, multiple electrical connectors 302 may be electrically connected to the same circuit card assembly 122.

The second electrical connector 302 is mounted to the PCB 300 at the mounting area 330. In the illustrated embodiment, the electrical connector 302 is a header connector having a mounting end 332 parallel to a mating end 334. For example, the mounting end 332 may be provided along one side of the electrical connector 302 and the mating end 334 may be provided at the opposite side of the electrical connector 302. Optionally, the mounting end 332 and the mating end 334 may be parallel to each other and non-coplanar. The electrical connector 302 extends between a front 336 (FIG. 2) and a rear 338 (FIG. 3) opposite the front 336. The mounting end 332 and the mating end 334 both extend between the front 336 and the rear 338. The mounting end 332 is mounted to the PCB 300. For example, the electrical connector 302 is mechanically and electrically terminated to the PCB 300 at the mounting end 332. In the illustrated embodiment, the mating end 334 is oriented for interfacing with the first electrical connector 202 when the second circuit card assembly 122 is received in the first slot 204.

In an exemplary embodiment, the mating end 334 is oriented generally vertically and extends parallel to the primary axis 316. The mating end 334 faces sideways rather than forward. For example, the mating end 334 is perpendicular to the mating edge 306 of the PCB 300. The front 336 is oriented generally vertically and extends parallel to the secondary axis 318. The front 336 may be positioned a first distance from the mating edge 306 (either forward of, rearward of or flush with the mating edge 306) and the rear 338 is positioned a second distance from the mating edge 306 greater than the first distance. The mating end 334 spans a majority of the distance between the front 336 and the rear 338. The front 336 is forward facing and, in the illustrated embodiment, is provided near the mating edge 306, such as generally flush with the mating edge 306.

When the first and second circuit card assemblies 120, 122 are mated, the first and second PCBs 200, 300 are internested and the second PCB 300 is received in the first slot 204. When mated, the first PCB 200 at least partially overlaps with the second PCB 300 to align the mating ends 234, 334 of the electrical connectors 202, 302. For example, the mating edges 206, 306 bypass each other as the second PCB 300 is received in the first slot 204. The front 336 of the second electrical connector 302 may be generally aligned with the rear 238 of the first electrical connector 202 and the front 236 of the first electrical connector 202 may be generally aligned with the rear 338 of the second electrical connector 302. During mating, the contacts 328 of the second electrical connector 302 are initially moved in the board loading direction 130 (for example, parallel to the primary axis 316 of the PCB 300) along the mating end 234 of the first electrical connector 202 until generally aligned with the corresponding contacts 228 of the first electrical connector 202, and then the contacts 228 of the first electrical connector 202 are moved in the connector mating direction 132 (for example, sideways or perpendicular to the board loading direction 130), with a portion of the first electrical connector 202, toward the second electrical connector 302. Due to the relative movement of the electrical connectors 202, 302 (for example, the second electrical connector 302 moving in the board loading direction 130 and the first electrical connector 202 moving in the connector mating direction 132), the contacts 228, 328 are mated in compound contact mating direction. In an exemplary embodiment, the contacts 228, 328 are oriented to accommodate mating in the contact mating direction. For example, the contacts 228, 328 are angled toward each other generally along an axis oriented in the contact mating direction (for example, at an angle between the board loading direction 130 and the connector mating direction 132).

FIG. 6 is a perspective view of a portion of the communication system 100 in accordance with an exemplary embodiment. FIG. 6 shows the second circuit card assembly 122 with the second slot 304 and the first circuit card assembly 120 without the first slot 204 (shown in FIG. 5). Optionally, at least a portion of the first PCB 200 is configured to at least partially fill the second slot 304. The second electrical connector 302 is mounted to the mounting area 330 adjacent the second slot 304. When the first and second circuit card assemblies 120, 122 are mated, the first and second PCBs 200, 300 are internested with the first PCB 200 being received in the second slot 304. When mated, the first PCB 200 at least partially overlaps with the second PCB 300 to align the mating ends 234, 334 of the electrical connectors 202, 302. For example, the mating edges 206, 306 bypass each other as the first PCB 200 is received in the second slot 304.

FIG. 7 is a perspective view of a portion of the communication system 100 in accordance with an exemplary embodiment. FIG. 7 shows the first circuit card assembly 120 with the first slot 204 and the second circuit card assembly 122 with the second slot 304. When the first and second circuit card assemblies 120, 122 are mated, the first and second PCBs 200, 300 are internested with the first PCB 200 being received in the second slot 304 and with the second PCB 300 being received in the first slot 204. When mated, the first PCB 200 at least partially overlaps with the second PCB 300 to align the mating ends 234, 334 of the electrical connectors 202, 302. For example, the mating edges 206, 306 bypass each other as the PCBs 200, 300 are received in the second and first slots 304, 204, respectively.

Figure 8:
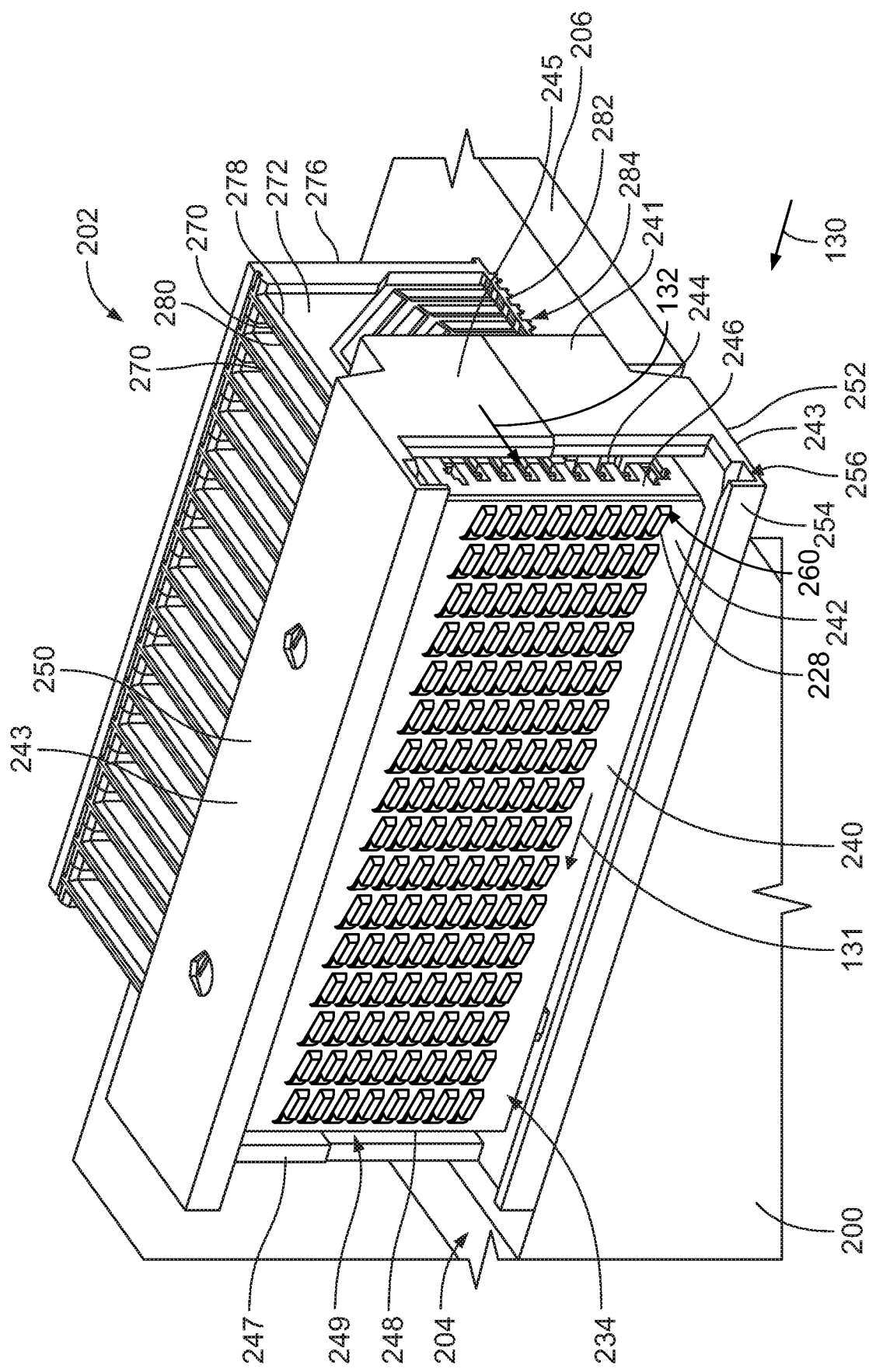
FIG. 8 is a perspective view of a portion of the first circuit card assembly showing the first electrical connector mounted to a first PCB.
Figure 9:
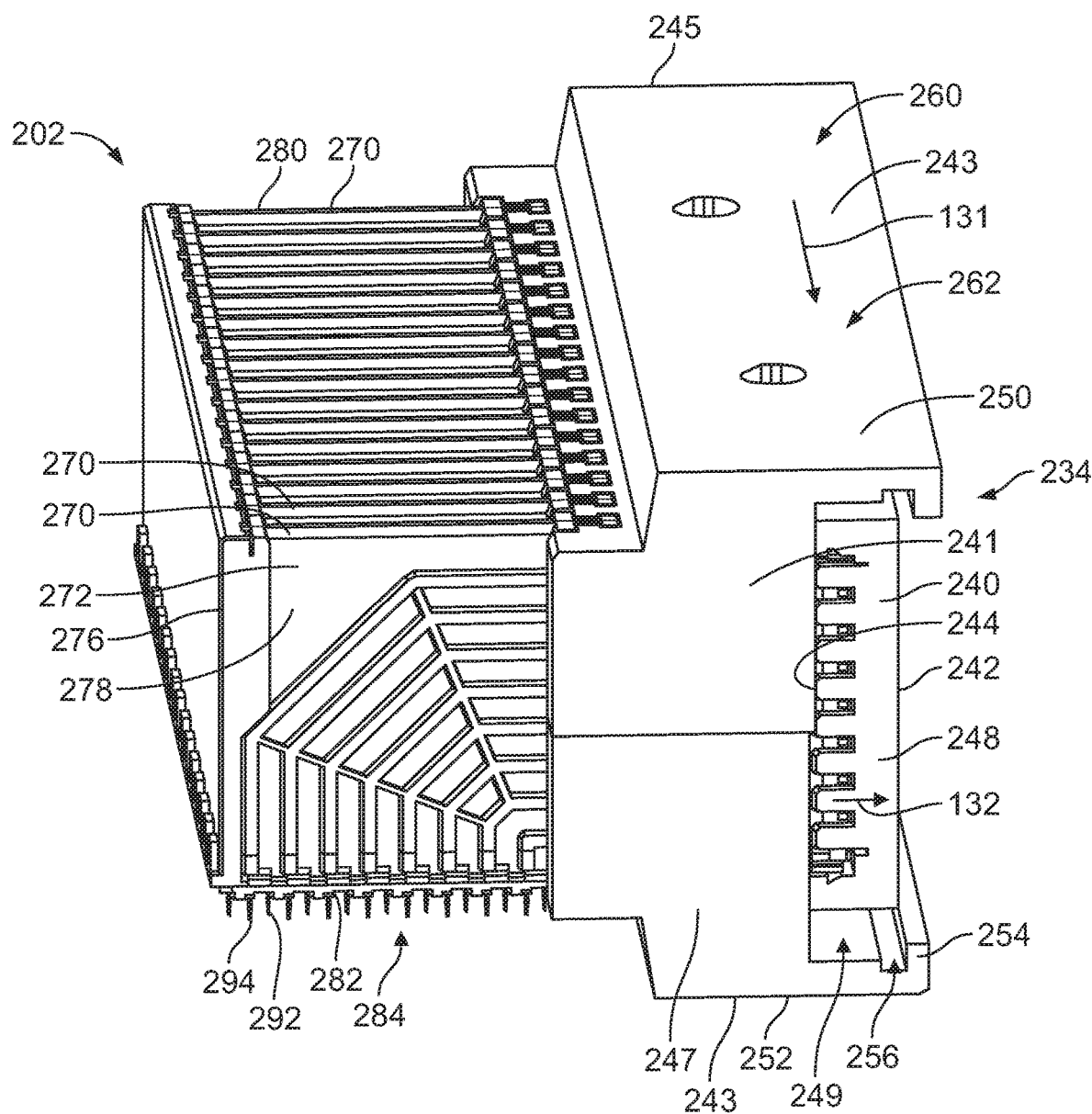
FIG. 9 is a rear perspective view of a first electrical connector of the first circuit card assembly in accordance with an exemplary embodiment.
Figure 10:
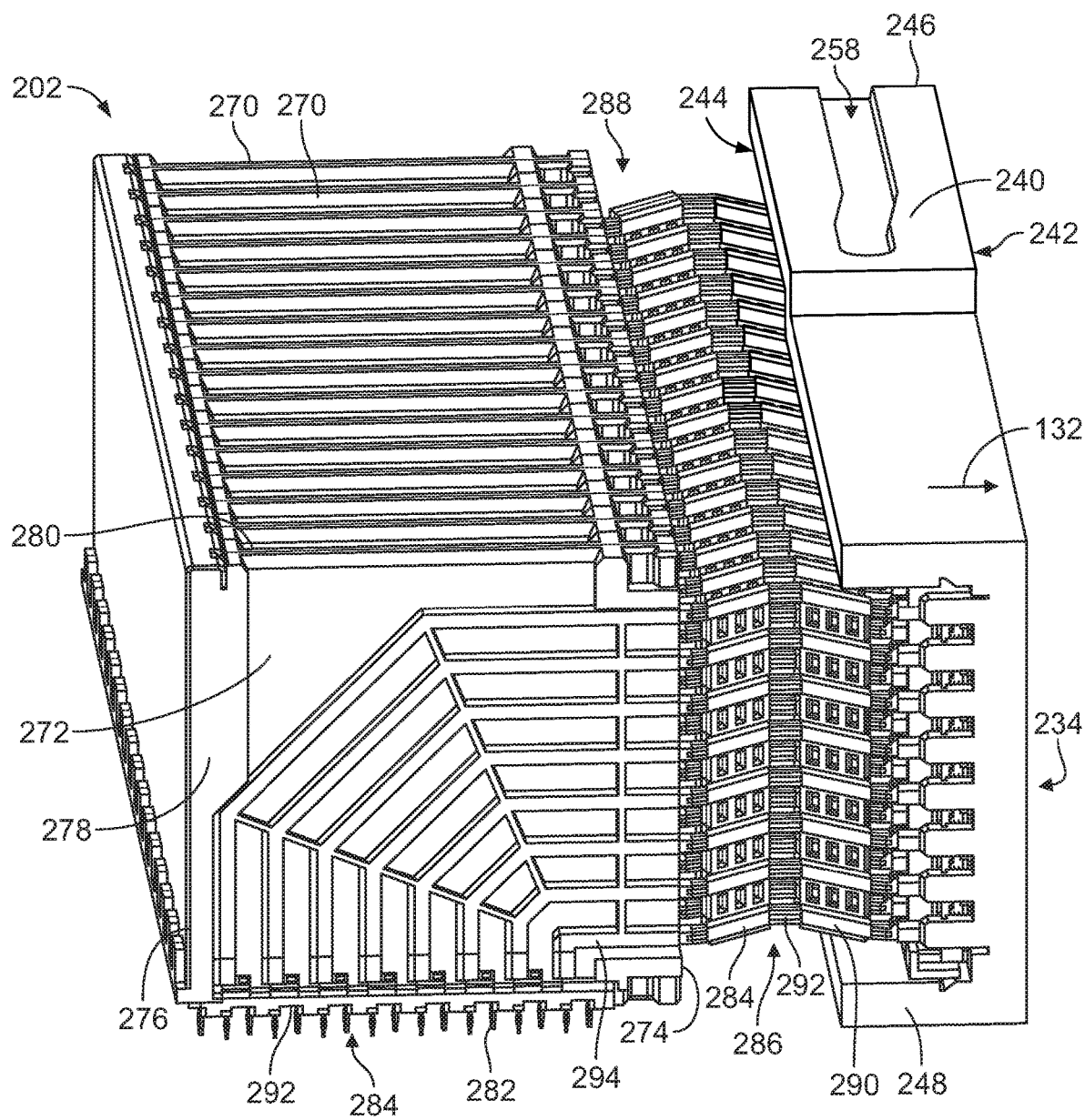
FIG. 10 is a rear perspective view of a portion of the first electrical connector in accordance with an exemplary embodiment.
Figure 11:
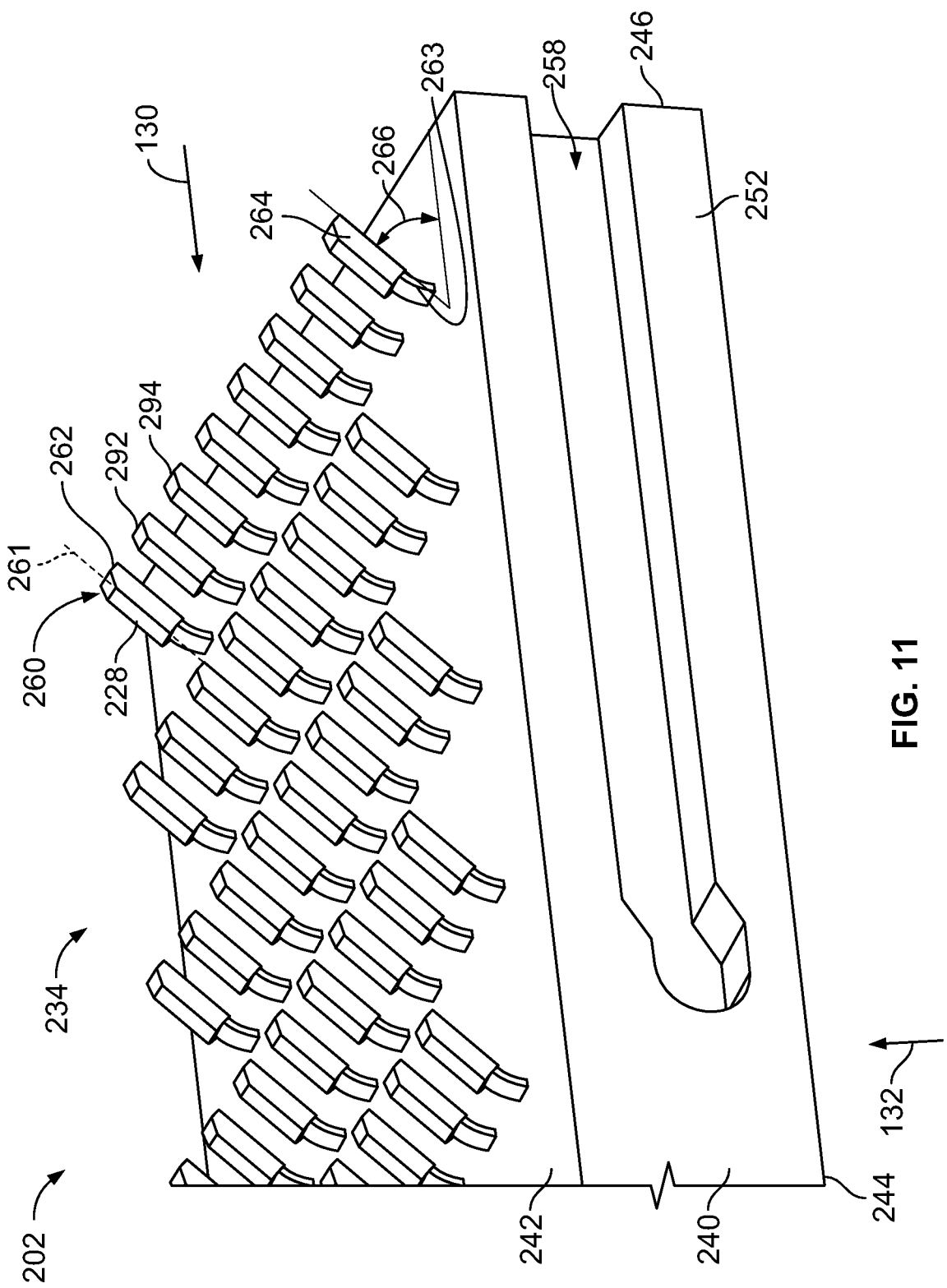
FIG. 11 is an end view of a portion of the first electrical connector in accordance with an exemplary embodiment.

FIG. 8 is a side perspective view of the first electrical connector 202 in accordance with an exemplary embodiment. FIG. 9 is a rear perspective view of the first electrical connector 202 in accordance with an exemplary embodiment. FIG. 10 is a rear perspective view of a portion of the first electrical connector 202 in accordance with an exemplary embodiment. FIG. 11 is a side perspective view of a portion of the first electrical connector 202 in accordance with an exemplary embodiment.

In an exemplary embodiment, the first electrical connector 202 includes a mating housing 240 at the mating end 234 and a receptacle housing 241 (removed in FIGS. 10 and 11 to illustrate other components) surrounding at least a portion of the mating housing 240. The mating housing 240 is movable within the receptacle housing 241, such as in a connector loading direction 131 and in the connector mating direction 132. Such movement allows mating of the first contacts 228 with the second contacts 328 (see FIG. 12) of the second electrical connector 302 (shown in FIG. 12) in a contact mating direction. Such movement allows positioning of the second electrical connector 302 relative to the first electrical connector 202 (for example, to generally align the contacts 228, 328) prior to the final mating movement.

The mating housing 240 includes a first side 242, a second side 244, a front 246 and a rear 248. The first side 242 defines the mating end 234 of the electrical connector 202. The mating end 234 is oriented perpendicular to the first PCB 200. In an exemplary embodiment, the mating housing 240 holds the contacts 228 for mating with the second electrical connector 302. The contacts 228 extend through contact channels in the mating housing 240. Each of the contacts 228 includes a mating end 260 extending from the first side 242 for mating with the second electrical connector 302. The mating ends 260 are provided at the first side 242 in a predetermined layout for mating with the second electrical connector 302. With reference to FIG. 11, the mating ends 260 have mating interfaces 262 configured to engage the contacts 328 when mated thereto. Each mating end 260 extends along a contact mating axis 261 between a neck 263 and a head 264. The head 264 extends to a tip configured to be mated with the contact 328. In the illustrated embodiment, the head 264 is a pin. However, other types of mating ends 260 may be provided in alternative embodiments, such as spring beams, sockets, and the like. In an exemplary embodiment, the mating end 260 is deflectable relative to the mating housing 240. For example, the neck 263 defines a compliant portion and allows the head 264 to move during mating with the contact 328. For example, the head 264 may rotate or pivot on the neck 263.

In an exemplary embodiment, the mating end 260 is cantilevered from the mating end 234 of the mating housing 240 and pitched forward toward the front 246 at the mating edge 206 of the PCB 200. As such, the mating end 260 faces the direction of loading of the second electrical connector 302. In an exemplary embodiment, the contact mating axis 261 is oriented at a contact mating angle 266. The contact mating angle 266 is angled in a direction that orients the contact 328 for mating with the corresponding contact 328. The contact mating angle 266 may be at an angle of between 30° and 60° relative to the board loading direction 130 in various embodiments. The contact mating angle 266 may be at an angle of between 30° and 60° relative to the connector mating direction 132 in various embodiments. In an exemplary embodiment, the contact mating axis 261 is angled non-parallel to the board loading direction 130 and non-parallel to the connector mating direction 132. The contact mating axis 261 is angled non-perpendicular to the board loading direction 130 and non-perpendicular to the connector mating direction 132. For example, the contact mating axis 261 may be angled at an angle between the board loading direction 130 and the connector mating direction 132.

The receptacle housing 241 includes end walls 243 extending between a front wall 245 and a rear wall 247. The walls 243, 245, 247 define a cavity 249 that receives the mating housing 240. In an exemplary embodiment, the end walls 243 are provided at a top 250 and a bottom 252 of the first electrical connector 202. In an exemplary embodiment, the first electrical connector 202 includes connecting elements 254 at the top 250 and the bottom 252 for connecting the first electrical connector 202 to the second electrical connector 302. In the illustrated embodiment, the connecting elements 254 are defined by grooves 256 in the receptacle housing 241 at the top 250 and the bottom 252 configured to receive portions of the second electrical connector 302. The connecting elements 254 secure the receptacle housing 241 to the second electrical connector 302 as the electrical connectors 202, 302 are coupled together (for example, as the PCBs 200, 300 are moved in the board loading direction). Other types of connecting elements 254 may be provided in alternative embodiments, such as pins, clips, fasteners, and the like.

The electrical connector 202 includes drive members 258 (FIGS. 10 and 11) at the top 250 and the bottom 252 for actuating the mating housing 240 relative to the receptacle housing 241 during mating. In the illustrated embodiment, the drive members 258 are cam slots configured to receive cam pins of the second electrical connector 302. The interaction between the cam pins and the cam slots drives the mating housing 240 in the connector mating direction 132. Other types of drive members may be provided to actuate or cause the relative driving movement of the mating housing 240 in the connector mating direction 132. As the drive members 258 are operated, the drive members 258 move the mating housing 240 sideways relative to the receptacle housing 241 in the connector mating direction 132. In an exemplary embodiment, the drive members 258 may be actuated by engagement with the second electrical connector 302 as the first and second electrical connectors 302 are coupled together. For example, actuators, such as pins, may be provided on the second electrical connector 302 to actuate the drive members 258 as the drive members 258 engage the pins. In an exemplary embodiment, multiple drive members 258 are provided, such as at a front section and a rear section of the electrical connector 202. More than two drive members 258 may be provided along either or both sides of the electrical connector 202. Other types of drive members 258 may be used in alternative embodiments. For example, the drive members may include rotatable cam levers rotatably positioned between the receptacle housing 241 and the mating housing 240 that engage and are actuated by the second electrical connector 302 during mating therewith. Other types of drive members 258 may be provided in alternative embodiments, such as pinions configured to engage a rack, a crank configured to engage a rack, a crank configured to engage an idler gear, one or more linkages configured to engage an actuator, and the like.

In an exemplary embodiment, the electrical connector 202 includes contact modules 270 each holding a plurality of the contacts 228. The contact modules 270 may be coupled to the receptacle housing 241 and/or the mating housing 240, such as at the second side 244. For example, in the illustrated embodiment, the contact modules 270 are loaded into the receptacle housing 241 behind the mating housing 240. In an exemplary embodiment, each contact module 270 includes a dielectric body 272 holding corresponding contacts 228. For example, the dielectric body 272 may be overmolded around portions of the contacts 228. Optionally, the contact modules 270 may include ground shields (not shown) to provide electrical shielding for the contacts 228.

The contact modules 270 each have a first side 274 facing the mating housing 240 and a second side 276 opposite the first side 274. The contact module 270 includes sides 278 facing each other when the contact modules 270 are stacked front to rear within the electrical connector 202. Any number of the contact modules 270 may be stacked together depending on the particular application. The number of contacts 228 within the electrical connector 202 may be increased or decreased by changing the number of contact modules 270 rather than retooling to increase the number of contacts per contact module, as is common in conventional systems, such retooling being expensive. The contact module 270 includes a top 280 and a bottom 282. The bottom 282 is configured to be mounted to the first PCB 200 (FIG. 8). Optionally, portions of the contacts 228 may extend below the bottom 282 for termination to the first PCB 200. For example, each of the contacts 228 may include a terminating end 284 (FIG. 9) configured to be terminated to the first PCB 200. For example, the terminating end 284 may be a compliant pin, such as an eye of the needle pin, configured to be press-fit into plated vias in the first PCB 200. In other various embodiments, the terminating end 284 may be a solder tail or another type of terminating end.

In an exemplary embodiment, the electrical connector 202 includes a compliant section 286 between the contact modules 270 and the mating housing 240 that allows the mating housing 240 to shift relative to the contact modules 270, such as during mating with the second electrical connector 302 (for example, in the connector mating direction 132 and/or in the connector loading direction 131). For example, the contact modules 270 may not engage the mating housing 240 in various embodiments. Rather, a gap 288 (FIG. 10) may be provided between the first sides 274 of the contact modules 270 and the second side 244 of the mating housing 240. The contacts 228 may span the gap 288 between the contact modules 270 and the mating housing 240. The contacts 228 include flexible sections 290 between the mating ends 260 and the terminating ends 284 to allow relative movement of the contacts 228 and the mating housing 240. The flexible sections 290 may be defined by sections of the contacts 228 that are not encased or enclosed by the dielectric body 272 and/or do not extend through the mating housing 240. For example, the flexible sections 290 may be located in the gap 288. Optionally, the flexible sections 290 may be enclosed or shrouded by a portion of the electrical connector 202, such as a shroud extending from the second side 244 of the mating housing 240 or a separate housing component.

In an exemplary embodiment, the contacts 228 include signal contacts 292 and ground contacts 294 (FIG. 11). Optionally, the signal contacts 292 may be arranged in pairs configured to convey differential signals. The ground contacts 294 are interspersed with the signal contacts 292 to provide electrical shielding for the signal contacts 292. For example, the ground contacts 294 may be provided between the pairs of signal contacts 292. Optionally, the ground contacts 294 may be provided above, below, and/or between the various pairs of signal contacts 292. The signal contacts 292 and/or the ground contacts 294 may be stamped and formed contacts.

As shown in FIG. 8, the bottoms 282 of the contact modules 270 are mounted to the PCB 200. In an exemplary embodiment, the mating housing 240 is positioned above the first slot 204 for mating with the second electrical connector 302 (shown in FIG. 2). In an exemplary embodiment, the mating housing 240 is movable relative to the PCB 200 and the contact modules 270, which are fixed to the PCB 200. For example, the flexible sections 290 of the contacts 228 defining the compliant section 286 of the electrical connector 202 allow the mating housing 240 to move relative to the PCB 200 during mating with the second electrical connector 302.

Figure 12:
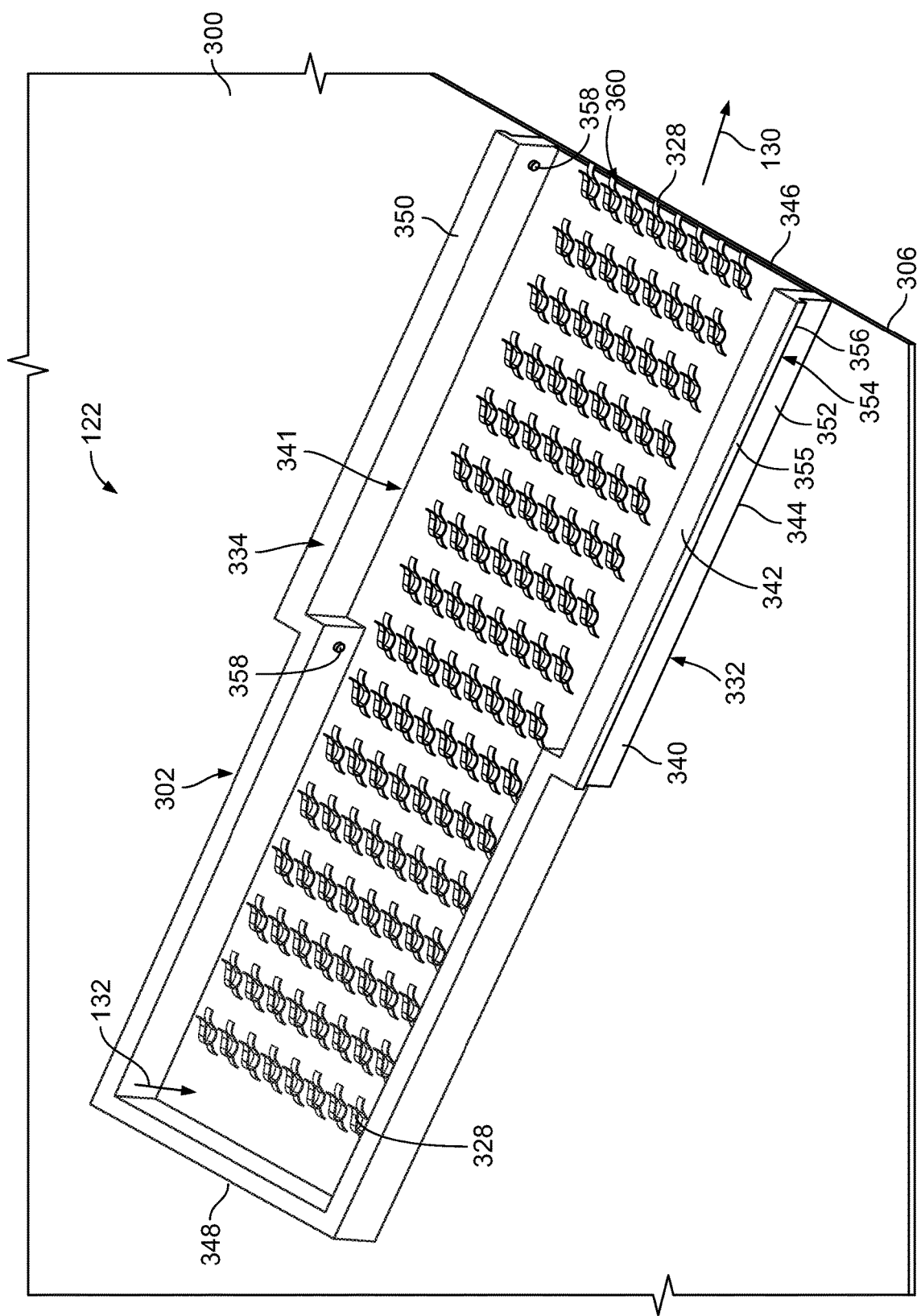
FIG. 12 is a perspective view of a second electrical connector in accordance with an exemplary embodiment.
Figure 13:
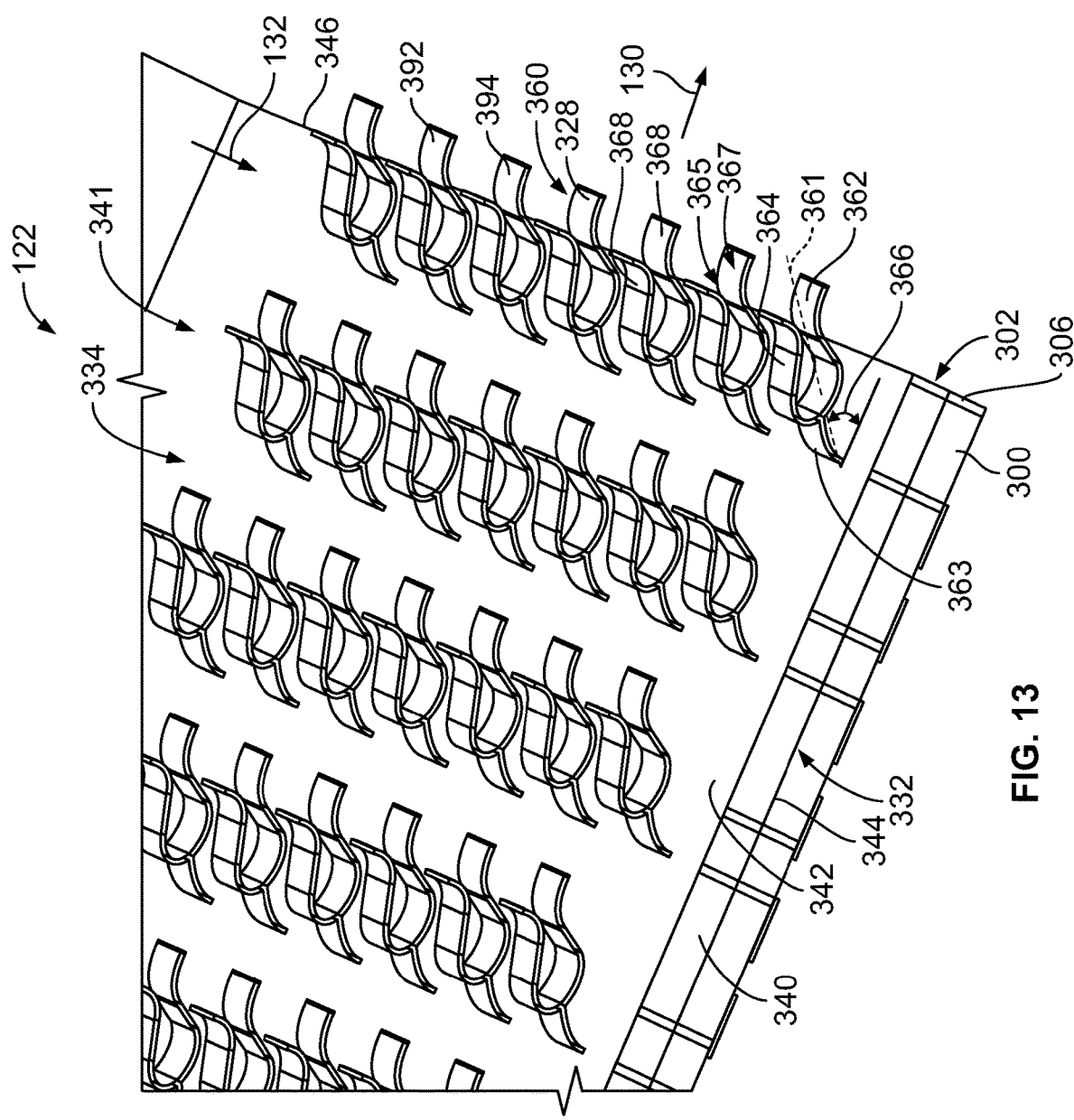
FIG. 13 is a perspective view of a portion of the second electrical connector in accordance with an exemplary embodiment.

FIG. 12 is a perspective view of the second electrical connector 302 of the second circuit card assembly 122 in accordance with an exemplary embodiment. FIG. 13 is a perspective view of a portion of the second electrical connector 302 in accordance with an exemplary embodiment. In an exemplary embodiment, the electrical connector 302 includes a header housing 340 holding the contacts 328. The header housing 340 includes walls defining a cavity 341 configured to receive the mating housing 240 of the first electrical connector 202 (both shown in FIG. 8).

The header housing 340 includes a first side 342, a second side 344, a front 346 and a rear 348. The first side 342 defines the mating end 334 of the electrical connector 302. The mating end 334 is oriented parallel to the second PCB 300. In an exemplary embodiment, the header housing 340 holds the contacts 328 for mating with the first electrical connector 202. For example, each of the contacts 328 includes a mating end 360 exposed at or beyond the first side 342 for mating with the first electrical connector 202. The mating ends 360 are provided at the first side 342 in a predetermined layout for mating with the first electrical connector 202. With reference to FIG. 13, the mating ends 360 have mating interfaces 362 for electrical connection with the first contacts 228. Each mating end 360 extends along a contact mating axis 361 between a neck 363 and a head 364. The head 364 extends to a tip configured to be mated with the contact 228. In the illustrated embodiment, the head 364 includes a socket 365 having an opening 367 between beams 368. The socket 365 receives the pin of the first contact 228. The beams 368 may be deflectable when flexed outward by the pin to compress against and electrically connect to the pin. However, other types of mating ends 360 may be provided in alternative embodiments, which may be complementary to the mating ends of the first contacts 228, such as spring beams, pins, and the like. In an exemplary embodiment, the mating end 360 is deflectable relative to the header housing 240. For example, the neck 363 defines a compliant portion and allows the head 364 to move during mating with the contact 228. For example, the head 364 may rotate or pivot on the neck 363.

In an exemplary embodiment, the mating end 360 is cantilevered from the mating end 334 of the header housing 340 and pitched forward toward the front 346 at the mating edge 306 of the PCB 300. As such, the mating end 360 faces the direction of mating of the second electrical connector 302 with the first electrical connector 202. In an exemplary embodiment, the contact mating axis 361 is oriented at a contact mating angle 366. The contact mating angle 366 is angled in a direction that orients the contact 328 for mating with the corresponding contact 228. The contact mating angle 366 may be at an angle of between 30° and 60° relative to the board loading axis 130 in various embodiments. The contact mating angle 366 may be at an angle of between 30° and 60° relative to the connector mating axis 132 in various embodiments. In an exemplary embodiment, the contact mating axis 361 is angled non-parallel to the board loading direction 130 and non-parallel to the connector mating direction 132. The contact mating axis 361 is angled non-perpendicular to the board loading direction 130 and non-perpendicular to the connector mating direction 132. For example, the contact mating axis 361 may be angled at an angle between the board loading direction 130 and the connector mating direction 132.

The header housing 340 includes a top 350 and a bottom 352. In an exemplary embodiment, the top 350 and the bottom 352 include connecting elements 354 for connecting the second electrical connector 302 to the first electrical connector 202. In the illustrated embodiment, the connecting elements 354 include flanges 356 defined by ledges 355 that face the second side 344. The flanges 356 are configured to interface with corresponding connecting elements 254 (shown in FIG. 8) of the receptacle housing 241 of the first electrical connector 202. The flanges 356 are configured to be received in corresponding grooves 256 (shown in FIG. 8). Other types of connecting elements 354 may be provided in alternative embodiments, such as pins, clips, fasteners, and the like.

The header housing 340 includes actuators 358 at the first side 342 configured to engage the drive members 258 (shown in FIGS. 10 and 11). In the illustrated embodiment, the actuators 358 are cam pins that are received in the cam slots defining the drive members 258. The cam pins are configured to ride in the cam slots as the header housing 340 is moved in the board loading direction 130. At the end of the cam slots, in the ramped section, the cam pins actuate the mating housing 240 toward the header housing 340 in the connector mating direction 132. In the illustrated embodiment, the header housing 340 includes multiple actuators 358 laterally spaced apart, such as for actuating multiple drive members 258.

The header housing 340 defines the mounting end 332 of the electrical connector 302 configured to be mounted to the PCB 300. Optionally, portions of the contacts 328 may extend beyond the mounting end 332 for termination to the PCB 300. For example, the contacts 328 may include terminating ends (not shown), such as compliant pins, solder tails, and the like, configured to be terminated to the PCB 300.

In an exemplary embodiment, such as shown in FIG. 13, the contacts 328 include signal contacts 392 and ground contacts 394. Optionally, the signal contacts 392 may be arranged in pairs configured to convey differential signals (differential pairs of signal contacts); however, the signal contacts 392 may convey single-ended signals rather than differential signals. The ground contacts 394 are interspersed with the signal contacts 392 to provide electrical shielding for the signal contacts 392. For example, the ground contacts 394 may be provided between the pairs of signal contacts 392.

Figure 14:
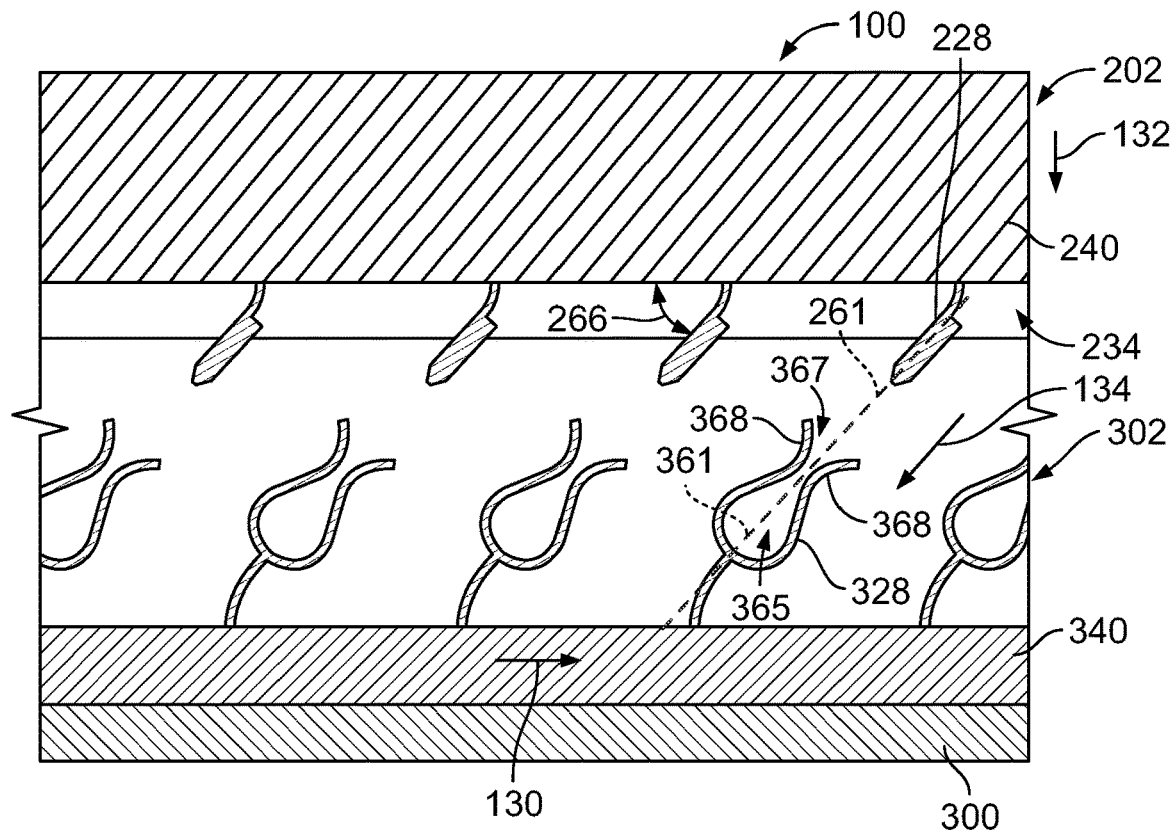
FIG. 14 illustrates a portion of the communication system showing a portion of the first electrical connector partially mated with the second electrical connector.
Figure 15:
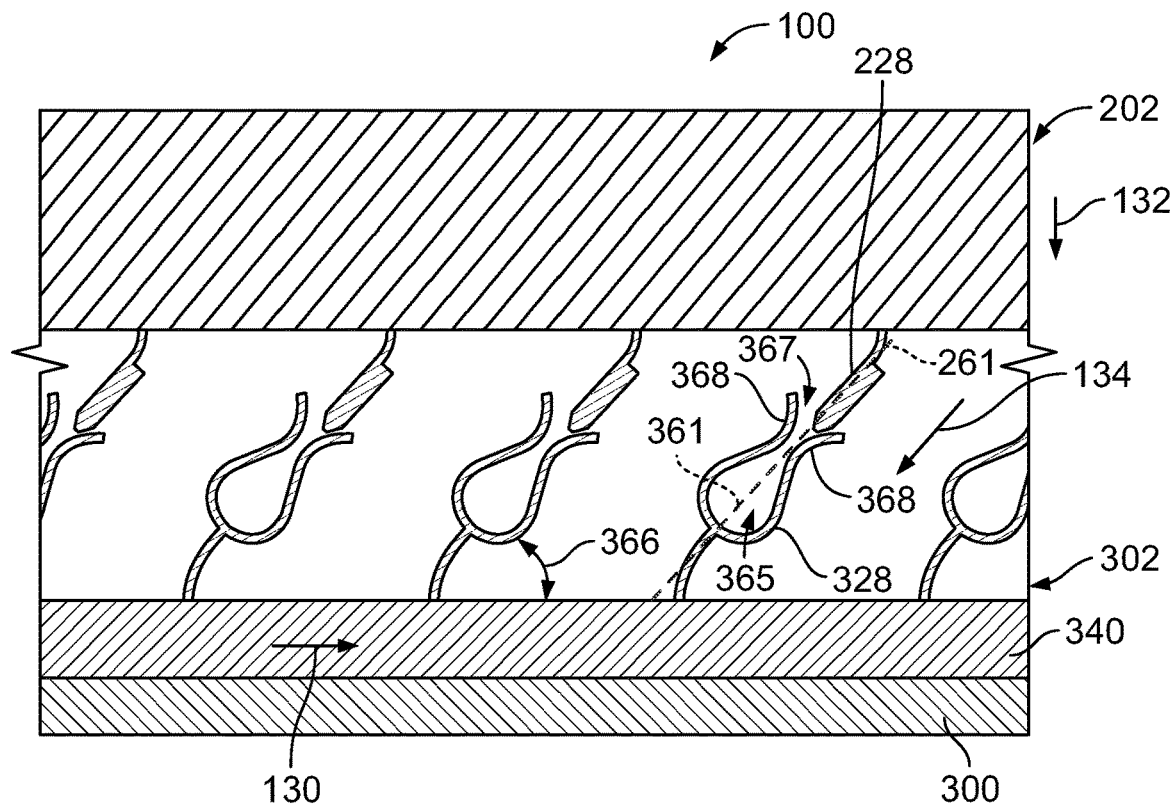
FIG. 15 illustrates a portion of the communication system showing a portion of the first electrical connector partially mated with the second electrical connector.

FIG. 14 illustrates a portion of the communication system 100 showing a portion of the first electrical connector 202 partially mated with the second electrical connector 302. FIG. 15 illustrates a portion of the communication system 100 showing a portion of the first electrical connector 202 partially mated with the second electrical connector 302.

During mating, the second electrical connector 302 is slid forward in the board loading direction 130 with the second PCB 300 into the slot 204 (shown in FIG. 8) in the first PCB 200 (shown in FIG. 8). The connecting elements 254 (shown in FIG. 8) of the first electrical connector 202 engage the connecting elements 354 (shown in FIG. 12) of the second electrical connector 302. The receptacle housing 241 guides loading of the header housing 340 into the cavity 249. As the header housing 340 is slid forward in the board loading direction 130, the actuators 358 (shown in FIG. 12) (for example, the cam slots) are configured to interact with the drive members 258 (FIG. 11) (for example, the cam pins). The drive members 258 may guide loading of the header housing 340 relative to the mating housing 240.

During loading, the second electrical connector 302 slides into the first electrical connector 202 (or the first electrical connector 202 into the second electrical connector 302) in the board loading direction 130, the header housing 340 is moved past the mating end 234 of the first electrical connector 202 to generally align the contacts 328 with the corresponding contacts 228 (FIG. 14). Once the contacts 228, 328 are in near alignment, the first electrical connector 202 may be moved in the connector mating direction 132 (FIG. 15). The connector mating direction 132 is perpendicular to the board loading direction 130. In an exemplary embodiment, the first and second electrical connectors 202, 302 are moved in the board loading direction 130 and the connector mating direction 132 simultaneously. For example, the first electrical connector 202 is moved in the connector mating direction 132 while the second electrical connector 302 is moved in the board loading direction 130. More particularly, the mating housing 240 is moved in the connector mating direction 132 while the header housing 340 is moved in the board loading direction 130. The interaction between the drive members 258 and the actuators 358 converts the linear movement of the header housing 340 and the board loading direction 130 into linear movement of the mating housing 240 in the connector mating direction 132.

The contacts 328 are held by the header housing 340 and the contacts 228 are held by the mating housing 240, which causes contact mating to occur at a skewed mating angle. Contact mating occurs in a contact mating direction 134. The contact mating direction 134 is neither parallel to the board loading direction 130 nor parallel to the connector mating direction 132. In an exemplary embodiment, the contact mating direction 134 is along the contact mating axes 261, 361 at the contact mating angles 266, 366. The contact 228 is aligned with the opening 367 between the beams 368 for reception in the socket 365. The opening 367 may have a large catch radius to receive the contact 228. Optionally, one of the beams 368 may be located below the contact 228 to ensure that further movement in the connector mating direction 132 directs the contact 228 into the socket 365. Optionally, one of the beams 368 may be located behind the contact 228 to ensure that further movement in the board loading direction 130 directs the contact 228 into the socket 365.

Figure 16:
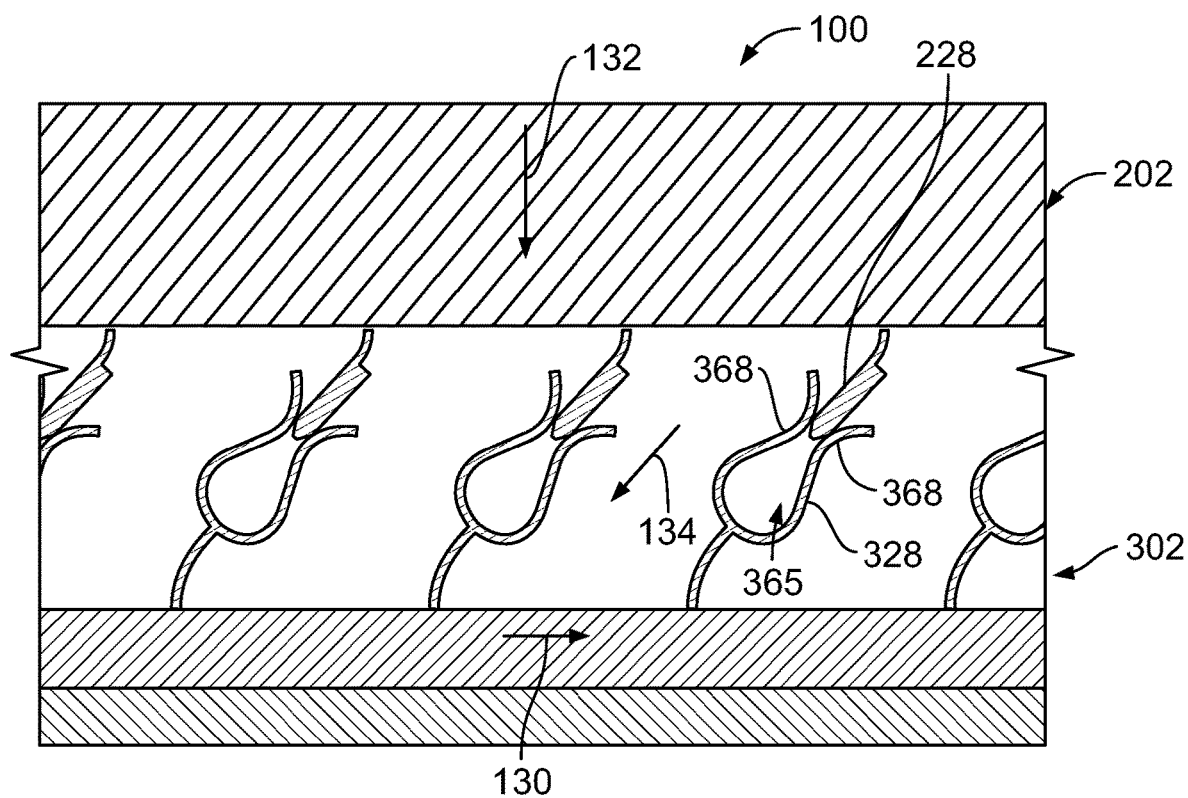
FIG. 16 illustrates a portion of the communication system showing a portion of the first electrical connector fully mated with the second electrical connector.

FIG. 16 illustrates a portion of the communication system 100 showing a portion of the first electrical connector 202 mated with the second electrical connector 302. During mating, the second electrical connector 302 continues to slide into the first electrical connector 202 in the board loading direction 130 from the partially loaded position (FIG. 15) and the first electrical connector 202 continues to move in the connector mating direction 132 from the partially loaded position (FIG. 15) to fully meet the contacts 228, 328. The contacts 228, 328 are mated in the contact mating direction 134. When fully mated, the contact 328 is received in the socket 365. The beams 368 are mechanically and electrically connected to the contact 328.

Figure 17:
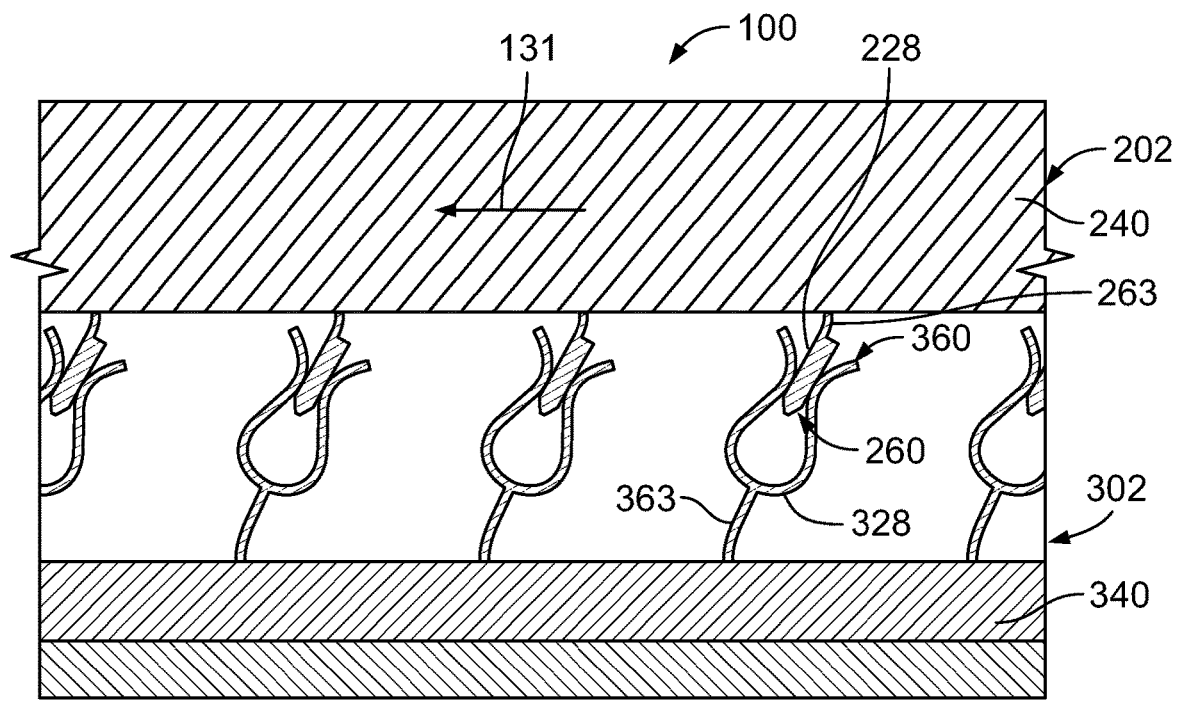
FIG. 17 illustrates a portion of the communication system showing a portion of the first electrical connector fully mated with the second electrical connector.

FIG. 17 illustrates a portion of the communication system 100 showing a portion of the first electrical connector 202 mated with the second electrical connector 302 with the second electrical connector 302 in an overloaded position. As the second circuit card assembly 122 is loaded into the slot 204 of the first PCB 200, the slot 204 is elongated for manufacturing tolerances to accommodate overloading of the second electrical connector 302 relative to the first electrical connector 202 beyond a fully loaded position. For example, the chassis 102 may receive the second circuit card assembly 122 in such position before bottoming out the second circuit card assembly 122 against a mechanical stop. The first electrical connector 202 accommodates loading of the second electrical connector 302 in the board loading direction a certain predetermined distance. In an exemplary embodiment, the mating housing 240 may be movable within the cavity 249 in the connector loading direction 131 to accommodate the overtravel. In an exemplary embodiment, the contacts 228, 328 are movable relative to each other and relative to the respective mating housing 240 and header housing 340. For example, the necks 263, 363 are flexible and define compliant portions of the mating ends 260, 360.

Figure 18:
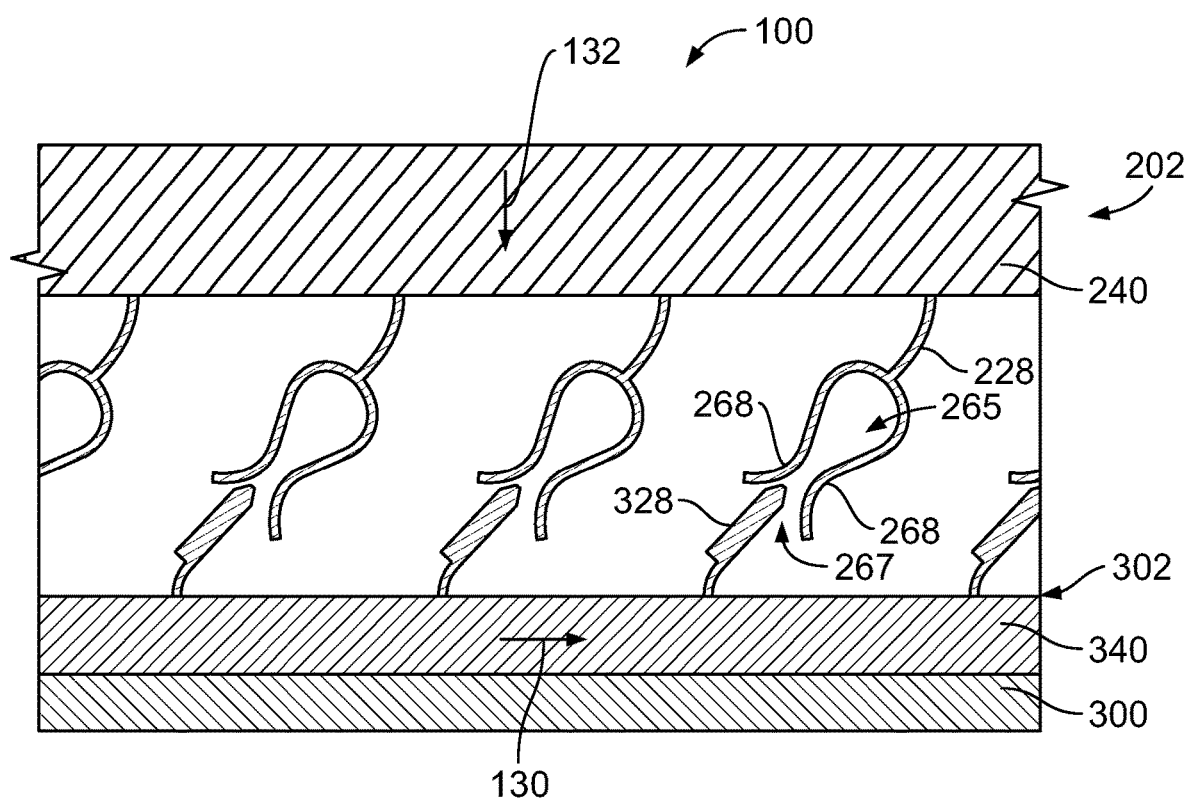
FIG. 18 illustrates a portion of the communication system showing a portion of the first electrical connector fully mated with the second electrical connector.

FIG. 18 illustrates a portion of the communication system 100 showing a portion of the first electrical connector 202 partially mated with the second electrical connector 302. FIG. 18 illustrates the first electrical connector 202 with the contacts 228 being socket contacts extending from the mating housing 240 rather than pin contacts. FIG. 18 illustrates the second electrical connector 302 with the contacts 328 being pin contacts extending from the header housing 340 rather than socket contacts. The second electrical connector 302 is mounted to the second PCB 300. The contacts 228 each include a socket 265 having an opening 267 between beams 268. The socket 265 receives the pin of the second contact 328. The contacts 228, 328 are angled at the contact mating angles 268, 368. The contacts 228, 328 are angled non-parallel to the board loading direction 130 and non-parallel to the connector mating direction 132.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A communication system comprising:
a first circuit card assembly having a first printed circuit board (PCB) and a first electrical connector, the first PCB including a first slot extending rearward from a first mating edge of the first PCB, the first electrical connector being mounted to the first PCB along the first slot, the first electrical connector having a first mating end and first contacts at the first mating end, each of the first contacts having a first mating interface; and
a second circuit card assembly having a second PCB and a second electrical connector, the second PCB having a second mating edge, the second electrical connector being mounted to the second PCB proximate to the second mating edge, the second electrical connector having a second mating end and second contacts at the second mating end, each of the second contacts having a second mating interface;
wherein the first and second circuit card assemblies are mated by loading the second PCB into the first slot in a board loading direction such that the first PCB and the second PCB move relative to each other along a board loading axis parallel to the first slot with the first PCB oriented perpendicular to the second PCB and with the first and second mating ends of the first and second electrical connectors being oriented parallel to the board loading axis, the second mating edge of the second PCB being received in the first slot to align the second mating end of the second electrical connector with the first mating end of the first electrical connector for mating the second electrical connector with the first electrical connector;
wherein the first electrical connector is mated with the second electrical connector in a connector mating direction along a connector mating axis perpendicular to the board loading axis; and
wherein the first mating interfaces of the first contacts are each oriented along a first beam axis from a root to a tip of the first contacts at first contact mating angles and the second mating interfaces of the second contacts are each oriented along a second beam axis from a root to a tip of the second contacts at second contact mating angles complementary to the first contact mating angles to guide mating of the first contacts with the second contacts as the first and second PCBs are mated in the board loading direction and the first and second connectors are mated in the connector mating direction, the first beam axis and the second beam axis at the first and second contact mating angles being non-parallel to the board loading axis and being non-parallel to the connector mating axis.

2. The communication system of claim 1, wherein the first and second contact mating angles are oriented in a contact mating direction non-parallel to the board loading axis and non-parallel to the connector mating axis.

3. The communication system of claim 1, wherein the first mating end faces the second mating end, each first contact has a first mating end extending from the first mating end of the first electrical connector along the first beam axis and each second contact has a second mating end extending from the second mating end of the second electrical connector along the second beam axis, the first beam axis being non-perpendicular to the first mating end of the first electrical connector, the second beam axis being non-perpendicular to the second mating end of the second electrical connector.

4. The communication system of claim 1, wherein the first and second contacts are deflectable to change the first and second contact mating angles during mating as the first and second PCBs are mated in the board loading direction and the first and second connectors are mated in the connector mating direction.

5. The communication system of claim 1, wherein the first contacts have first mating ends and the second contacts have second mating ends, the first mating ends of the first contacts being either pins or sockets, the second mating ends of the second contacts being the other of pins or sockets.

6. The communication system of claim 1, wherein the first contacts are cantilevered from the first mating end at the first contact mating angles such that the first contacts are non-parallel to the first mating end and non-perpendicular to the first mating end, the first contacts being pitched toward the first mating edge at the first contact mating angles for mating with the second contacts.

7. The communication system of claim 1, wherein each first contact includes a mating end extending along a first contact mating axis between a neck and a head, the first mating axis being non-perpendicular to the mating end of the electrical connector, the head being mated with the corresponding second contact in a contact mating direction along the corresponding first contact mating angle.

8. The communication system of claim 7, wherein the neck is compliant to allow the head to move relative to the mating end of the first electrical connector during mating with the corresponding second contact.

9. The communication system of claim 1, wherein the first and second PCBs move relative to each other along the board mating axis while the first and second electrical connectors move relative to each other along the connector mating axis.

10. The communication system of claim 1, wherein the first contact mating angle is at an angle of between 30° and 60° relative to the board loading axis and the first contact mating angle is at an angle of between 30° and 60° relative to the connector mating axis, and wherein the second contact mating angle is at an angle of between 30° and 60° relative to the board loading axis and the second contact mating angle is at an angle of between 30° and 60° relative to the connector mating axis.

11. The communication system of claim 1, wherein the first electrical connector includes a receptacle housing fixed relative to the first PCB and having a cavity, the first electrical connector including a mating housing received in the cavity of the receptacle housing, the mating housing being movable relative to the receptacle housing within the cavity, the mating housing holding the first contacts, wherein the mating housing moves in the board loading direction with the receptacle housing, and wherein the mating housing is configured to move independent of the receptacle housing in the connector mating direction.

12. A circuit card assembly for a communication system comprising:
a printed circuit board (PCB) having a first surface and a second surface extending along a primary axis and a secondary axis, the PCB having a mating edge between the first and second surfaces generally parallel to the secondary axis, the PCB having a mounting area on the first surface adjacent the mating edge; and
an electrical connector mounted to the first surface at the mounting area, the electrical connector having a housing extending between a front and a rear, the front being provided proximate to the mating edge, the electrical connector having a mounting end extending between the front and the rear being mounted to the mounting area, the electrical connector having a mating end extending between the front and the rear along the primary axis, the mating end being configured to be mated to a mating electrical connector, the electrical connector having contacts held by the housing being terminated to the PCB, each contact having a mating end extending along a mating axis between a neck and a head, the head having a tip configured to be mated with a mating contact in a contact mating direction along the mating axis, the mating axis being angled non-perpendicular to the mating end of the electrical connector.

13. The circuit card assembly of claim 12, wherein the contacts are deflectable at the neck to change a contact mating angle during mating with the mating contact.

14. The circuit card assembly of claim 12, wherein the head is a socket configured to receive the mating contact.

15. The circuit card assembly of claim 12, wherein the head is a pin configured to be loaded into the mating contact.

16. The circuit card assembly of claim 12, wherein the contact is cantilevered from the mating end of the electrical connector and pitched toward the mating edge at a contact mating angle for mating with the mating contact.

17. A communication system comprising:
a first circuit card assembly having a first printed circuit board (PCB) and a first electrical connector mounted to the first PCB, the first PCB having a first surface and a second surface extending along a primary axis and a secondary axis, the first PCB having a first mating edge between the first and second surfaces generally parallel to the secondary axis of the first PCB, the first PCB having a first slot between the first and second surfaces open at the first mating edge and extending a length generally along the primary axis of the first PCB, the first PCB having a first mounting area on the first surface adjacent the first slot with the first electrical connector mounted to the first mounting area, the first electrical connector having a front and a rear opposite the front, a mounting end extending between the front and the rear being mounted to the mounting area, and a mating end extending between the front and the rear generally parallel to the primary axis of the first PCB, the first electrical connector having first contacts including mating ends at the mating end of the first electrical connector and terminating ends at the mounting end of the first electrical connector terminated to the first PCB, each of the first contacts having a first mating interface; and
a second circuit card assembly having a second PCB and a second electrical connector mounted to the second PCB, the second PCB having a first surface and a second surface extending along a primary axis and a secondary axis, the second PCB having a second mating edge between the first and second surfaces generally parallel to the secondary axis of the second PCB, the second PCB having a second mounting area on the first surface proximate to the second mating edge with the second electrical connector mounted to the second mounting area, the second electrical connector having a front and a rear opposite the front, a mounting end extending between the front and the rear being mounted to the mounting area, and a mating end extending between the front and the rear generally parallel to the primary axis of the second PCB, the second electrical connector having second contacts including mating ends at the mating end of the second electrical connector and terminating ends at the mounting end of the second electrical connector terminated to the second PCB, each of the second contacts having a second mating interface, the second mating edge of the second PCB being received in the first slot to align the mating end of the second electrical connector with the mating end of the first electrical connector;

wherein the first and second circuit card assemblies are mated by loading the second PCB into the first slot in a board loading direction such that the first PCB and the second PCB move relative to each other along a board loading axis parallel to the first slot with the first PCB oriented perpendicular to the second PCB and with the first and second mating ends of the first and second electrical connectors being oriented parallel to the board loading axis, the second mating edge of the second PCB being received in the first slot to align the second mating end of the second electrical connector with the first mating end of the first electrical connector for mating the second electrical connector with the first electrical connector;

wherein the first electrical connector is mated with the second electrical connector in a connector mating direction along a connector mating axis perpendicular to the board loading axis; and wherein the mating ends of the first contacts extend along a corresponding first beam axes axis oriented at first contact mating angles and the mating ends of the second contacts extend along a corresponding second beam axis oriented at second contact mating angles complementary to the first contact mating angles for mating the first and second contacts in a contact mating direction as the first and second PCBs are mated in the board loading direction and the first and second connectors are mating in the connector mating direction, the contact mating direction being non-parallel to the board loading axis and being non-parallel to the connector mating axis.

18. The communication system of claim 17, wherein the first and second contacts are deflectable to change contact mating angles during mating as the first and second circuit card assemblies are mated in the board loading direction and the first and second connectors are mated in the connector mating direction.

19. The communication system of claim 17, wherein the mating ends of the first contacts are either pins or sockets and the mating ends of the second contacts are the other of pins or sockets.

20. The communication system of claim 17, wherein the first contacts are cantilevered from the first mating end and pitched toward the first mating edge at contact mating angles for mating with the second contacts.

\* \* \* \* \*